(12) United States Patent
Miyamoto et al.

(10) Patent No.: US 6,829,563 B2
(45) Date of Patent: Dec. 7, 2004

(54) SIMULATION METHOD FOR ESTIMATING PERFORMANCE OF PRODUCT MADE OF VISCOELASTIC MATERIAL

(75) Inventors: Kazuyoshi Miyamoto, Hyogo (JP); Masahiko Ueda, Hyogo (JP); Masaki Shiraishi, Hyogo (JP)

(73) Assignee: Sumitomo Rubber Industries, Ltd., Kobe (JP)

( * ) Notice: Subject to any disclaimer, the term of this patent is extended or adjusted under 35 U.S.C. 154(b) by 66 days.

(21) Appl. No.: 10/140,244

(22) Filed: May 8, 2002

(65) Prior Publication Data

US 2003/0055601 A1 Mar. 20, 2003

(30) Foreign Application Priority Data

May 31, 2001 (JP) ......................................... 2001-165882
Jun. 6, 2001 (JP) ......................................... 2001-170933
Jun. 6, 2001 (JP) ......................................... 2001-171594

(51) Int. Cl.$^7$ ......................... G06F 17/60; G06F 17/50; G06F 19/00; G01N 3/00; G01N 33/44
(52) U.S. Cl. ......................... 702/182; 702/187; 73/789; 73/866.4; 703/6; 703/9
(58) Field of Search ......................... 702/182, 41–43, 702/187; 703/6–7, 9, 2; 73/866.4, 804, 787, 789–798

(56) References Cited

U.S. PATENT DOCUMENTS

| | | | | |
|---|---|---|---|---|
| 4,181,029 A | * | 1/1980 | Talbott, Jr. ................... | 73/665 |
| 5,129,443 A | * | 7/1992 | Yano et al. ............. | 73/866.4 X |
| 5,373,750 A | * | 12/1994 | Butler et al. ................ | 73/866.4 |
| 5,379,235 A | * | 1/1995 | Fisher et al. .............. | 73/789 X |
| 5,402,366 A | * | 3/1995 | Kihara et al. .................. | 703/9 |
| 6,519,536 B1 | * | 2/2003 | Brunacci et al. .......... | 702/41 X |
| 6,556,944 B2 | * | 4/2003 | Miyamoto et al. .......... | 702/155 |

FOREIGN PATENT DOCUMENTS

| | | | | |
|---|---|---|---|---|
| JP | 2003-28788 | * | 1/2003 | .......... G01N/19/00 |
| JP | 2003-83874 | * | 3/2003 | .......... G06F/17/50 |
| JP | 2003-139668 | * | 5/2003 | ............ G01N/3/00 |

* cited by examiner

*Primary Examiner*—Thomas P. Noland
(74) *Attorney, Agent, or Firm*—Birch, Stewart, Kolasch & Birch, LLP

(57) ABSTRACT

A simulation method of estimating performance of a product made of a viscoelastic material, comprising the steps of measuring a value of a strain, a strain speed, and a stress generated in viscoelastic material momently in a measuring condition equivalent to a state in which the product is actually used; deriving time history data of a viscosity resistance of the viscoelastic material separately in each of a strain increase state and a strain decrease state from time history data of the strain, the strain speed, and the stress and a viscoelastic model set in consideration of a viscosity of the viscoelastic material; setting the product as a product model whose performance is analyzed and inputting a relationship among the strain, the strain speed, and the viscosity resistance to the product model to conduct a simulation in consideration of a phenomenon that the viscosity resistance changes in dependence on a variation of the strain and the strain speed and in consideration of a difference in the viscosity resistance between a strain increase state and a strain decrease state.

7 Claims, 34 Drawing Sheets

SIMULATION METHOD FOR ESTIMATING PERFORMANCE OF PRODUCT MADE OF VISCOELASTIC MATERIAL

BACKGROUND OF THE INVENTION

1. Field of the Invention

The present invention relates to a simulation method for estimating the performance of a product made of a viscoelastic material. More particularly, the present invention relates to a simulation method for accurately estimating the performance of the product made of the viscoelastic material by means of a simulation.

2. Description of the Related Art

A viscoelastic material represented by a macromolecular material such as rubber or elastomer is widely applied to various products such as tires, balls for sports, rolls for printing machines.

It is expensive and takes much time to make a trial manufacture. Thus to save cost and time, simulation is made in various industrial fields to develop various products made of the viscoelastic material or a metal material. For example, to estimate the restitution performance of a golf ball, simulation methods of actual hitting tests are proposed.

To conduct the simulation, physical-property values such as the rigidity, viscosity, and the like of a material measured by a viscoelastic spectrum meter and physical-property values such as a modulus of direct elasticity (Young's modulus) of a constituting material of a ball measured by a tension tester are used as input data in the simulation. In particular, because the viscoelastic spectrum meter measures the physical-property values of a dynamic strain-applied specimen, the viscoelastic spectrum meter is useful for simulating products made of the viscoelastic material.

However in measurement conducted by using the viscoelastic spectrum meter and the tension tester for measuring the modulus of direct elasticity, a large deformation amount cannot be imparted to the specimen. Thus a maximum strain speed applied to the specimen made of the viscoelastic material at a measuring time is as low as 0.001/s to 1.0/s and a maximum compression strain is also as low as 0.0001 to 0.02.

A product made of the viscoelastic material may deform rapidly and greatly owing to the influence of an external force applied thereto when it is actually used. For example, when a golf ball is hit, a maximum strain speed of a material for the golf ball is as high as 500/s to 5000/s and a maximum compression strain thereof is as large as 0.05–0.50.

As described above, the viscoelastic spectrum meter and the tension tester for measuring the modulus of direct elasticity are incapable of measuring the physical-property values of the viscoelastic material in a state equivalent to a condition where the product made of the viscoelastic material deforms quickly and greatly when it is actually used. Thus the maximum strain speed of the viscoelastic material and its maximum compression strain measured at a simulation time are much different from those measured at the time when the product made of it is actually used. Therefore the conventional simulation method of inputting the physical-property value obtained by using the viscoelastic spectrum meter and the tension tester is incapable of accomplishing an accurate simulation by taking the physical property of the viscoelastic material into consideration.

That is, it is known that the deformation behavior of the viscoelastic material when an impact load is applied thereto is different from that of the viscoelastic material when a static load is applied thereto. That is, the deformation behavior of the viscoelastic material is greatly influenced by a deformation amount or a deformation speed. In particular, when a macromolecular material such as rubber and elastomer is subjected to the impact load, it deforms at a speed as high as several seconds by 10000 or several seconds by 1000 and as greatly as by several tens of percentages in a quantitative respect. There are many viscoelastic materials that deform at such a high speed and in such a large amount. To develop products efficiently, there is a demand for conducting an accurate simulation. More specifically, the performance of a product such the golf ball depends on a dynamic behavior in a condition where it deforms greatly and quickly upon application of an impact thereto when it is hit. The performance of the product also depends on the characteristic of the material thereof. Therefore to develop a product, it is indispensable to conduct an accurate simulation in a condition equivalent to a condition in which the product made of the material is actually used.

Some viscoelastic materials change in the physical properties thereof such as the loss factor, rigidity (modulus of direct elasticity), and the like in dependence on the magnitude of a strain and a strain speed when an external force such as an impact load is applied thereto. That is, the viscoelastic material is diverse in its deformation speed and deformation magnitude. Thus depending on the deformation speed and the deformation magnitude, the physical property of the viscoelastic material has a property that it changes not linearly but nonlinearly. More specifically, as the viscoelastic material is deformed by an external force applied thereto and strained increasingly, the loop area of an S-S (strain-stress) curve increases and the physical properties such as the loss factor thereof change owing to a deformation state (speed and magnitude of deformation) thereof, thus showing nonlinearity in its property. Many viscoelastic materials have a high nonlinearity in their properties. Thus there is a demand for conducting an accurate simulation for a product made of such a viscoelastic material.

However there are no methods capable of accurately expressing a phenomenon that the physical property of the viscoelastic material, for example, its loss factor changes nonlinearly in a high extent in dependence on the deformation speed of and deformation magnitude thereof. Simulations have been hitherto conducted on the assumption that the physical-property value of the viscoelastic material composing the golf ball or the like hardly changes. Consequently the conventional simulation method has a disadvantage that it is incapable of correctly estimating the performance of the product made of the viscoelastic material in an actual use. Thus to estimate the performance of the product, trial manufacture cannot but be made.

SUMMARY OF THE INVENTION

The present invention has been made in view of the above-described situation. Thus, it is an object of the present invention to provide a simulation method of accurately estimating the performance of a product made of a viscoelastic material showing a nonlinearity in its property in a condition in which the product is actually used.

To achieve the object, according to the present invention, there is provided a simulation method for estimating performance of a product made of a viscoelastic material, comprising the steps of measuring a value of a strain, a strain speed, and a stress generated in the viscoelastic material momently in a measuring condition equivalent to a state in which the product is actually used; deriving time history data of a viscosity resistance of the viscoelastic material from time history data of the strain, the strain speed, and the stress and a viscoelastic model set in consideration of a viscosity of the viscoelastic material; and setting the product made of the viscoelastic material as a product model whose performance is analyzed and inputting a relationship among the strain, the strain speed, and the viscosity resistance to the product model to conduct a simulation in consideration of a phenomenon that the viscosity resistance changes in dependence on a variation of the strain and the strain speed. Thereby the performance of the viscoelastic model made of the viscoelastic material is estimated.

In the first aspect of the present invention, using the viscoelastic model set in consideration of the viscosity of the viscoelastic material, the simulation is conducted by deriving the viscosity resistance of the viscoelastic material and inputting the relationship among the strain, the strain speed, and the viscosity resistance to the product model. Therefore it is possible to accurately express a phenomenon that the physical property of the viscoelastic material changes nonlinearly with its deformation speed and deformation magnitude. Further because the value of each of the strain, the strain speed, and the strain is measured in a measuring condition equivalent to a state in which the product made of the viscoelastic material is actually used, it is possible to conduct a simulation in correspondence to various deformation states of the viscoelastic material. Accordingly it is possible to accurately estimate the performance of the product made of the viscoelastic material in which the relationship between the strain and the strain speed generated therein changes owing to a deformation state of the viscoelastic material and whose physical property such as a loss factor shows nonlinearity.

The time history data of the viscosity resistance of the viscoelastic material is derived from the time history data of each of the strain, the strain speed, and the stress and from the viscoelastic model set in consideration of the viscosity of the viscoelastic material. More specifically, from the viscoelastic model, the relationships among the strain, the strain speed, the modulus of direct elasticity, and the viscosity resistance are established as an equation respectively. In this manner, the viscosity resistance of the viscoelastic material is expressed as the function of the strain and the strain speed. The modulus of direct elasticity of the viscoelastic material is derived in correspondence to the strain and the stress, generated therein, obtained by the measurement. The value of the viscosity resistance is derived by substituting the modulus of direct elasticity, the strain, and the strain speed into the function. Since the time history data of each of the strain, the strain speed, and the stress is obtained by the measurement, time history data of the viscosity resistance corresponding to the strain and the strain speed can be obtained. As described above, the viscosity resistance is determined in dependence on the value of the strain and the strain speed and thus changes in correspondence to a variation of the strain and the strain speed that is made with the elapse of time.

The product made of the viscoelastic material is set as a product model whose performance is analyzed. The relationship among the strain, the strain speed, and the viscosity resistance is inputted to computation input data including the product model, a speed, a restriction condition, and the like to conduct a simulation in consideration of the phenomenon that the viscosity resistance changes in dependence on the variation of the strain and the strain speed.

The relationship among the strain, the strain speed, and the viscosity resistance is inputted to the product model at a computing time in the simulation. More specifically, two-dimensional data of the relationship between the strain and the strain speed and the relationship between the strain and the viscosity resistance are inputted to the product model for a computation. It is possible to input three-dimensional data of the relationship among the strain, the strain speed, and the viscosity resistance to the product model. That is, the data of the viscosity resistance can be inputted to the product model as the function of the strain and the strain speed to perform a computation.

In inputting the two-dimensional data of each of the relationship between the strain and the strain speed and the relationship between the strain and the viscosity resistance to the product model, the strain, the strain speed, and the viscosity resistance corresponding to the strain as well as the strain speed are written as input data by using the above-described relationships. More specifically, the strain, the strain speed, and the like are measured in a plurality of measuring conditions, and the relationship between the strain and the strain speed is recorded from time series data of the strain and the strain speed in each of different patterns having different measuring conditions. The value of the viscosity resistance corresponding to each curve is also recorded. By properly adjusting the relationship among the strain, the strain speed, and the viscosity resistance, the viscosity resistance at a given strain and a given strain speed is accurately derived for a computation.

In the second aspect of the present invention, there is provided a simulation method for estimating performance of a product made of a viscoelastic material, comprising the steps of measuring a value of a strain, a strain speed, and a stress generated in the viscoelastic material momently in a measuring condition equivalent to a state in which the product is actually used; computing a plurality of different moduli of direct elasticity from history data of the strain and that of the stress and deriving a relationship among the strain, the strain speed, and the modulus of direct elasticity; setting the product made of the viscoelastic material as a product model whose performance is analyzed and inputting the relationship among the strain, the strain speed, and the modulus of direct elasticity to the product model to conduct a simulation in consideration of a phenomenon that the modulus of direct elasticity changes in dependence on a variation of the strain and the strain speed. Thereby the performance of the viscoelastic model made of the viscoelastic material is estimated.

As described above, in the second aspect of the present invention, the rigidity (modulus of direct elasticity) of the viscoelastic material which changes in dependence on a deforming condition is computed from the time history data of the strain and the stress measured in the above-described measuring condition to conduct a simulation in consideration of the change of the modulus of direct elasticity corresponding to the variation of the strain and the strain speed. Therefore it is possible to accurately express the phenomenon that the physical property of the viscoelastic material changes nonlinearly in dependence on its deformation speed and deformation magnitude.

Further because the value of each of the strain, the strain speed, and the strain is measured in a measuring condition equivalent to a state in which the product made of the viscoelastic material is actually used, it is possible to conduct a simulation in correspondence to various deformation states of the viscoelastic material.

Accordingly it is possible to accurately estimate the performance of the product made of the viscoelastic material in which the relationship between the strain and the strain speed generated therein changes owing to a deformation state of the viscoelastic material and whose physical property such as a loss factor shows nonlinearity.

The modulus of direct elasticity shown by an inclination of a stress-strain curve is computed in each measuring condition from the time history data of each of the stress and the strain to determine the modulus of direct elasticity corresponding to the strain and the strain speed. That is, an appropriate rigidity of the viscoelastic material can be expressed by changing the modulus of direct elasticity of a spring of the viscoelastic model in correspondence to the strain and the strain speed.

The time history data of the viscosity resistance of the viscoelastic material is derived from the time history data of each of the strain, the strain speed, and the stress, the modulus of direct elasticity corresponding to the strain and the strain speed, and the viscoelastic model set in consideration of the viscosity of the viscoelastic material. More specifically, the relationships among the strain, the strain speed, the modulus of direct elasticity, and the viscosity resistance are established as an equation respectively. In this operation, the modulus of direct elasticity is found in correspondence to the strain and the strain speed, and the viscosity resistance is expressed as the function of the strain, the strain speed, and the modulus of direct elasticity. The value of the viscosity resistance is derived in consideration of the variation of the modulus of direct elasticity by substituting the modulus of direct elasticity, the strain, and the strain speed, and the modulus of direct elasticity into the function. Since the time history data of each of the strain, the strain speed, and the stress is obtained, the time history data of the viscosity resistance corresponding to the strain and the strain speed can be obtained.

The product made of the viscoelastic material is set as a product model whose performance is analyzed. The relationship among the strain, the strain speed, and the modulus of direct elasticity is inputted to computation input data including the product model, a speed, a restriction condition, and the like to conduct a simulation in consideration of the phenomenon that the modulus of direct elasticity changes in dependence on the variation of the strain and the strain speed.

The relationship among the strain, the strain speed, and the modulus of direct elasticity is inputted to the product model at a computing time in the simulation. More specifically, two-dimensional data of the relationship between the strain and the strain speed and the relationship between the strain and the modulus of direct elasticity are inputted to the product model for a computation. It is possible to input three-dimensional data of the relationship among the strain, the strain speed, and the modulus of direct elasticity to the product model. That is, the data of the modulus of direct elasticity can be inputted to the product model as the function of the strain and the strain speed to perform a computation.

Based on the result of measurement and by using the above-described relationship, the strain, the strain speed, the modulus of direct elasticity corresponding to the strain as well as the strain speed, and the viscosity resistance are written as input data. More specifically, the strain, the strain speed, and the like are measured in a plurality of measuring conditions, and the relationship between the strain and the strain speed is recorded from time series data of the strain and the strain speed in each of different patterns having different measuring conditions. The value of the modulus of direct elasticity corresponding to each curve is also recorded. By computing the viscosity resistance momently from the value of each of the strain, the strain speed, and the modulus of direct elasticity, properly adjusting the relationship among the strain, the strain speed, and the modulus of direct elasticity, and including the relationship among them into the computation for the simulation, the physical-property value of the viscoelastic material at a given strain and a given strain speed is accurately derived for the computation.

In the third aspect of the present invention, there is provided a simulation method for estimating performance of a product made of a viscoelastic material, comprising the steps of measuring a value of a strain, a strain speed, and a stress generated in the viscoelastic material momently in a measuring condition equivalent to a state in which the product is actually used; deriving time history data of a viscosity resistance of the viscoelastic material separately in each of a strain increase state and a strain decrease state or a restoration state from time history data of the strain, the strain speed, and the stress and a viscoelastic model set in consideration of a viscosity of the viscoelastic material; setting the product made of the viscoelastic material as a product model whose performance is analyzed and inputting a relationship among the strain, the strain speed, and the viscosity resistance to the product model to conduct a simulation in consideration of a phenomenon that the viscosity resistance changes in dependence on a variation of the strain and the strain speed and in consideration of a difference in the viscosity resistance between a strain increase state and a strain decrease state or a restoration state. Thereby the performance of the viscoelastic model made of the viscoelastic material is estimated.

As described above, in the third aspect of the present invention, using the viscoelastic model set in consideration of the viscosity of the viscoelastic material, the simulation is conducted by deriving the viscosity resistance of the viscoelastic material separately in each of the strain increase state and the strain decrease state and inputting the relationship among the strain, the strain speed, and the viscosity resistance to the product model. Therefore it is possible to accurately express a phenomenon that the physical property of the viscoelastic material changes nonlinearly with its deformation speed and deformation magnitude. There is a case in which at an equal value of the strain, the value of the viscosity resistance in the strain increase state is different from the value thereof in the strain decrease state (or restoration state). Therefore the simulation can be accomplished with high precision by differentiating the value of the viscosity resistance in the strain increase state and that of the viscosity resistance in the strain decrease state or the restoration state from each other. Further because the value of each of the strain, the strain speed, and the strain is measured in a measuring condition equivalent to a state in which the product made of the viscoelastic material is actually used, it is possible to conduct a simulation in correspondence to various deformation states of the viscoelastic material. Accordingly it is possible to accurately estimate the performance of the product made of the viscoelastic material in which the relationship between the strain and the strain speed changes owing to a deformation state of the viscoelastic material and whose physical property such as a loss factor shows nonlinearity.

The time history data of the viscosity resistance of the viscoelastic material is derived separately in each of the strain increase state and the strain decrease state or the restoration state from the time history data of each of the strain, the strain speed, and the stress and from the viscoelastic model set in consideration of the viscosity of the viscoelastic material. More specifically, the relationships among the strain, the strain speed, the modulus of direct elasticity, and the viscosity resistance are established as an equation respectively. In this manner, the viscosity resistance is expressed as the function of the strain and the strain speed by differentiating the value of the viscosity resistance in the strain increase state from that of the viscosity resistance in the strain decrease state or the restoration state. The modulus of direct elasticity of the viscoelastic material is derived in correspondence to the strain and the stress, generated therein, obtained by the measurement. The value of the viscosity resistance is derived by substituting the modulus of direct elasticity, the strain, and the strain speed into the function. Since the time history data of each of the strain, the strain speed, and the stress is obtained, the time history data of the viscosity resistance corresponding to the strain and the strain speed can be obtained. As described above, the viscosity resistance is determined in dependence on the value of the strain and the strain speed and thus changes in correspondence to the variation of the strain and the strain speed which is made with the elapse of time. The deformation state generated in the viscoelastic material can be divided into the "strain increase state" in which the strain increases in the compression direction thereof and the "restoration state" in which the compression amount thereof decreases gradually. Therefore the simulation is conducted separately in each of the strain increase state and the strain decrease state (or restoration state). Depending on a case, the deformation state generated in the viscoelastic material can be divided into a stress-applied state and a stress-eliminated state.

The product made of the viscoelastic material is set as a product model whose performance is analyzed. The relationship among the strain, the strain speed, and the viscosity resistance is inputted to computation input data including the product model, a speed, a restriction condition, and the like to conduct a simulation in consideration of the phenomenon that the viscosity resistance changes in dependence on the variation of the strain and the strain speed and in consideration of the difference in the viscosity resistance between the strain increase state and the strain decrease state or the restoration state.

The relationship among the strain, the strain speed, and the viscosity resistance is inputted to the product model at a computing time in the simulation. More specifically, two-dimensional data of the relationship between the strain and the strain speed and the relationship between the strain and the viscosity resistance are inputted to the product model for a computation. It is possible to input three-dimensional data of the relationship among the strain, the strain speed, and the viscosity resistance to the product model. That is, the data of the viscosity resistance can be inputted to the product model as the function of the strain and the strain speed to perform a computation.

In inputting the two-dimensional data of each of the relationship between the strain and the strain speed and the relationship between the strain and the viscosity resistance to the product model, the strain, the strain speed, and the viscosity resistance, corresponding to the strain as well as the strain speed, different in its value between the strain increase state and the strain decrease state or the restoration state are written as input data by using the above-described relationships. More specifically, the strain, the strain speed, and the like are measured in a plurality of measuring conditions, and the relationship between the strain and the strain speed is recorded from time series data of the strain and the strain speed in each of different patterns having different measuring conditions. The value of the viscosity resistance corresponding to each curve is also recorded. By properly adjusting the relationship among the strain, the strain speed, and the viscosity resistance, the viscosity resistance at a given strain and a given strain speed is accurately derived for a computation.

In the simulation method of the first, second, third aspects of the present invention, the value of each of the strain, the strain speed, and the stress generated in the product made of the viscoelastic material is measured momently in a measuring condition equivalent to a state in which the product is actually used. More specifically, the measuring condition is set equivalently to a state in which a product made of the viscoelastic material is actually used and deforms owing to an external force applied to the product. The value of each of the strain, the strain speed, and the stress generated in the product made of the viscoelastic material is measured momently in the above-described measuring condition to obtain the time history data of each of the strain, the strain speed, and the stress. Thus it is possible to obtain the information of a deformation state of the viscoelastic material, assuming that the product made of the viscoelastic material is actually used and an external force is applied to the product. Thereby it is possible to correctly estimate the property of the, viscoelastic material which deforms greatly and quickly when it is subjected to an impact load.

It is preferable to measure the value of each of the strain, the strain speed, and the stress momently in a plurality of measuring conditions. By altering the magnitude of the external force applied to the product made of the viscoelastic material and setting a plurality of measuring conditions, it is possible to obtain data of various patterns about the strain, the strain speed, and the stress and improve the accuracy of input values in the simulation. To obtain data with possible largest number of patterns, it is preferable to measure the value of each the strain, the strain speed, and the stress from a time when the stain is generated in the viscoelastic material upon application of an external force until the strain becomes approximately zero. It is also preferable to measure the values thereof at short intervals.

It is preferable to compose the viscoelastic model of a spring and a dashpot in view of the viscosity of the viscoelastic material. Such a viscoelastic model simplifies the viscosity of the viscoelastic material, it is easy to consider the influence of the viscosity on a deformation state of the viscoelastic material. More specifically, a maxwell model, Voight model, and a combination of a plurality of springs and dashpots are favorable. To simplify the construction of the viscoelastic model, a two-component model is favorable. These viscoelastic material models are used in such a way that the viscosity resistance of the dashpot and the rigidity of the spring (modulus of direct elasticity E or shear coefficient) are variable. The shear coefficient is a physical-property value determined by the modulus of direct elasticity (Young's modulus) E and Poisson's ratio.

The more the number of measuring conditions is, the more accurately the physical property of the viscoelastic material can be realized in a condition in which different strains and strain speeds are measured. Thus it is preferable to measure the strain, the strain speed, and the like in a plurality of different measuring conditions. However the more the number of the measuring conditions is, the more it takes to perform a computation in conducting the simulation. In the case of a strain and a strain speed not the same as the data of the strain and the strain speed measured under a predetermined measuring condition, it is preferable to compute the modulus of direct elasticity by using an interpolation. As the interpolation, a primary interpolation is performed by using a binary value of the modulus of direct elasticity determined in dependence on a strain and a strain speed close to the strain and the strain speed measured under the predetermined measuring condition or an interpolation which is performed by using values measured in all predetermined measuring conditions. By performing such an interpolating operation, it is possible to compute the viscosity resistance and the modulus of direct elasticity in correspondence to a variation, of the strain and the strain speed generated in the viscoelastic material, which is made according to measuring conditions.

The simulation method of the present invention allows a correct simulation of the property and deformation behavior of the viscoelastic material showing nonlinearity in its property, assuming that a product made of the viscoelastic material is actually used. By using the viscoelastic model whose viscosity resistance is determined by the value of the strain and the strain speed and computing its viscosity resistance, as described above in the characteristic of the first and third aspect of the present invention, it is possible to consider the nonlinearity of the viscoelastic material showing not linearity in its physical property but nonlinearity, namely, deforming according to its deformation speed and deformation magnitude. In particular, it is possible to accurately simulate the viscoelastic material whose loss factor shows a high nonlinearity and thereby estimate the performance of a product made of the viscoelastic material, assuming that the product is actually used. By using the viscoelastic model whose modulus of direct elasticity is determined by the value of the strain and the strain speed, as described above in the characteristic of the second aspect of the present invention, it is possible to accurately simulate the viscoelastic material whose modulus of direct elasticity shows the nonlinearity and thereby estimate the performance of a product made of the viscoelastic material, assuming that the product is actually used.

It is preferable to conduct the simulation method of the present invention by a finite element method.

In conducting the simulation method by the finite element method, a large number of nodal points and elements are set on the product model. That is, in estimating the property of the viscoelastic material composing a product by simulating the product by the finite element method, the modulus of direct elasticity of a spring of the viscoelastic model is determined by the strain and the strain speed generated in each element. Thereby for each element, it is possible to indicate the property of the viscoelastic material in a proper condition of a strain and a strain speed.

Needless to say, instead of the modulus of direct elasticity, a shear coefficient may be used in relation to the Poisson's ratio. Whether the modulus of direct elasticity or the shear coefficient is used depends on the specification of the program of the finite element method.

The strain, the strain speed, and the stress are measured by a split Hopkinson's bar tester. The split Hopkinson's bar tester is capable of straining a specimen very quickly and greatly. That is, owing to the use of the split Hopkinson's bar tester, it is possible to obtain time series data of each of the strain, the strain speed, and the stress of the viscoelastic material in a measuring condition in which the viscoelastic material deforms by several tens of percentages at a speed as high as several seconds by 10000 or several seconds by 1000 and as great as by several tens of percentages in a quantitative respect. Assuming the condition of a strain and a strain speed generated in the specimen by the split Hopkinson's bar tester is equivalent to a condition of a strain and a strain speed generated in the viscoelastic material when an impact load is applied to a product made of the viscoelastic material, it is possible to obtain physical properties of the viscoelastic material in correspondence to various states such as a state in which the viscoelastic material deforms very quickly and greatly. Thus by using the physical property measured by the split Hopkinson's bar tester, the accuracy of the simulation can be improved.

The split Hopkinson's bar tester is capable of measuring physical properties of the material composing the specimen in various regions of the strain and the strain speed by only altering the collision speed of its impact bar which applies an impact to the specimen. Therefore the split Hopkinson's bar tester makes it possible to obtain the physical properties of the material in various strains and strain speeds.

The split Hopkinson's bar tester is originally used to evaluate an impact behavior of a metal material. In the present invention, the split Hopkinson's bar tester is improved in its construction to evaluate the viscoelastic material having viscosity. The method of measuring the physical property of a material by using the split Hopkinson's bar tester will be described later.

Needless to say, the physical property of the material may be measured by a measuring method other than the method carried out by using the split Hopkinson's bar, provided that a specimen can be deformed greatly at a high speed and the physical property of the material of the specimen can be measured in a measuring condition equivalent to a condition in which a product made of the material is actually used.

When a strain, a strain speed, and a stress generated in a viscoelastic material are measured in a measuring condition equivalent to a condition in which a product made of the viscoelastic material is actually used, a maximum value of the strain generated in the viscoelastic material is in the range of 0.05 to 0.50 and/or a maximum value of the strain speed is in the range of 500/s to 10000/s and favorably in the range of 500/s to 5000/s.

The range of the maximum value of the strain and that of the strain speed are the condition of the strain and the strain speed generated when the viscoelastic material deforms very quickly and greatly. Thus to estimate the performance of the product when it deforms very quickly and greatly, it is preferable to use time series data of each of the strain, the strain speed, and the stress in this condition.

The viscoelastic material is used for a golf ball. The product model is a golf ball. The golf ball is a product made of the viscoelastic material. When the golf ball is actually used, an external force such as an impact load is applied thereto and it deforms at a very high speed and in a large amount. The state of the golf ball deforming at a very high speed and in a large amount affects the performance of the golf ball in a high extent. Therefore the analysis based on the simulation method of the present invention is very useful for estimating the performance of the golf ball. The simulation method is capable of estimating the performance of the golf ball with high accuracy without making a trial manufacture. Thus the simulation method allows efficient designing of the golf ball.

A phenomenon of a collision between the golf ball and a hitting object assumed to be a golf club head is simulated to estimate the behavior of the golf ball at the time of the collision. The simulation method is capable of estimating the physical property of the viscoelastic material composing the golf ball, assuming that the viscoelastic material is subjected to a strain, a strain speed, and a stress equivalent to those generated in the viscoelastic material of the golf ball when it is actually hit with the golf club head. Therefore simulation method is capable of estimating the restitution coefficient of the golf ball and the behavior of the golf ball such as a deformation state thereof when it is hit.

The simulation method of the present invention is applicable to a so-called one-piece golf ball, a so-called two-piece golf ball made of a core made of cross-linked rubber and a cover covering the core, and a so-called multi-piece golf ball made of three or more layers. That is, the simulation method of the present invention is applicable to golf balls made of the viscoelastic material and having any constructions.

The viscoelastic material includes viscoelastic materials. For example, thermoplastic resin, thermosetting resin, elastomers, and rubber can be used. It is possible to use these viscoelastic materials singly or a mixture thereof. It is possible to add additives such as a colorant, a deterioration prevention agent, and a cross-linking agent to each of these viscoelastic materials and the mixture thereof as necessary. The simulation method is applicable to all materials so long as the strain, strain speed, and stress thereof can be measured in a condition where a product made of them is actually used.

As the viscoelastic material, it is possible to use synthetic resin such as ionomer which is used as a material for a golf ball, polybutadiene (butadiene rubber), natural rubber, polyisoprene, styrene-butadiene copolymer, ethylene-propylene-diene copolymer (EPDM), and urethane rubber.

As products made of the viscoelastic material, in addition to the golf ball, a rubber roller for a printing apparatus, a tire, and sports goods, for example, goods for tennis, golf, and the like are known. It is necessary that the viscoelastic material composes at least one part of a product. The viscoelastic material may be used in combination with other materials such as a metal material to form a composite-molded product. The simulation method is capable of estimating the performance of a portion, of the product, constructed of the viscoelastic material. The simulation method is preferably applicable to a product that deforms very quickly and greatly when it is subjected to an impact load. The simulation method is capable of estimating the performance of the product and its dynamic behavior with high accuracy.

DETAILED DESCRIPTION OF THE PREFERRED EMBODIMENTS

The embodiment of the present invention will be described below with reference to the drawings.

In the simulation method according to the first of the present invention, as a viscoelastic material showing nonlinearity, a golf ball-composing material containing butadiene rubber as its main component is used. A split Hopkinson's bar tester improved in its construction to measure a strain, a strain speed, and a stress generated in the material containing the butadiene rubber as its main component. The split Hopkinson's bar tester measures them momently in a measuring condition in which the material deforms greatly at a high speed, assuming that a golf ball made of the material is actually used (hit). The method of measuring the strain, the strain speed, and the stress generated in the viscoelastic material by using the split Hopkinson's bar tester will be described later.

Figure 1:
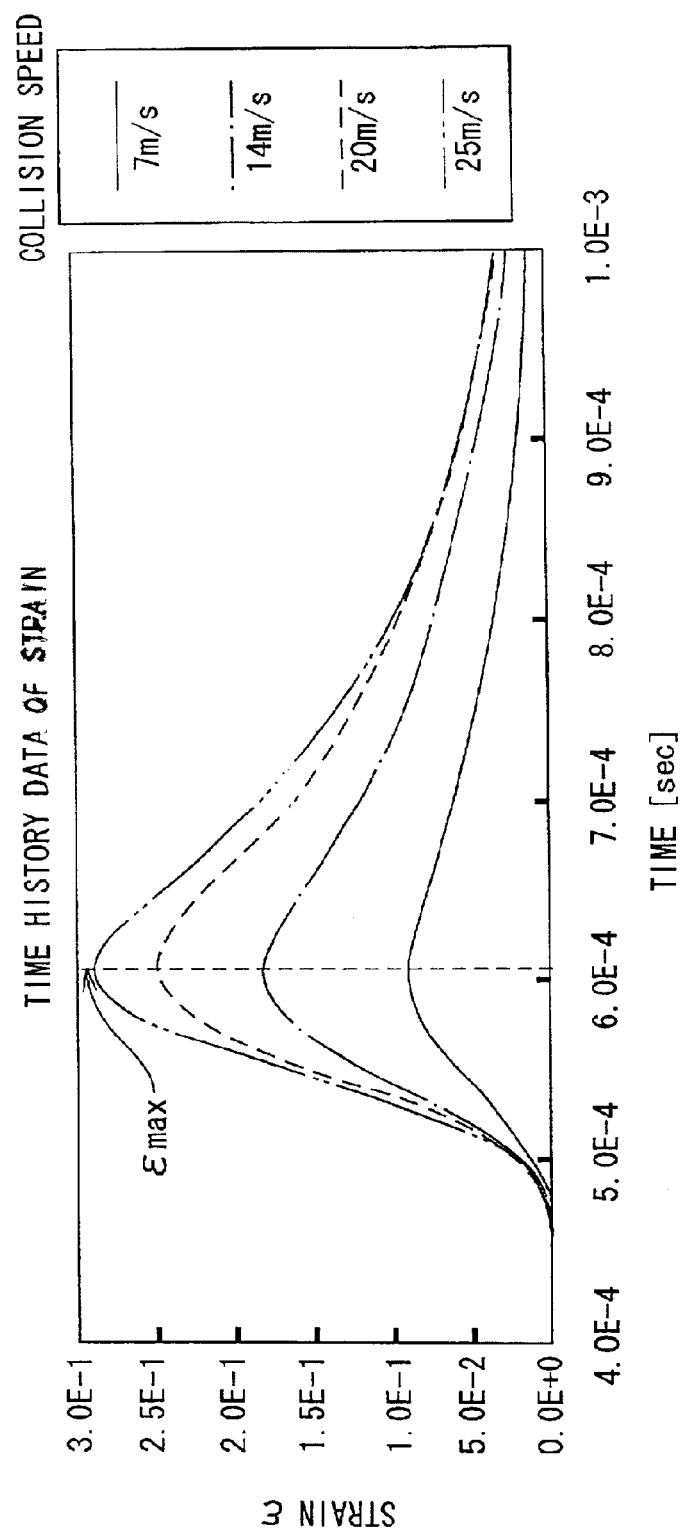
FIG. 1 shows time history data of a strain $\epsilon$ in a first embodiment of the present invention.
Figure 2:
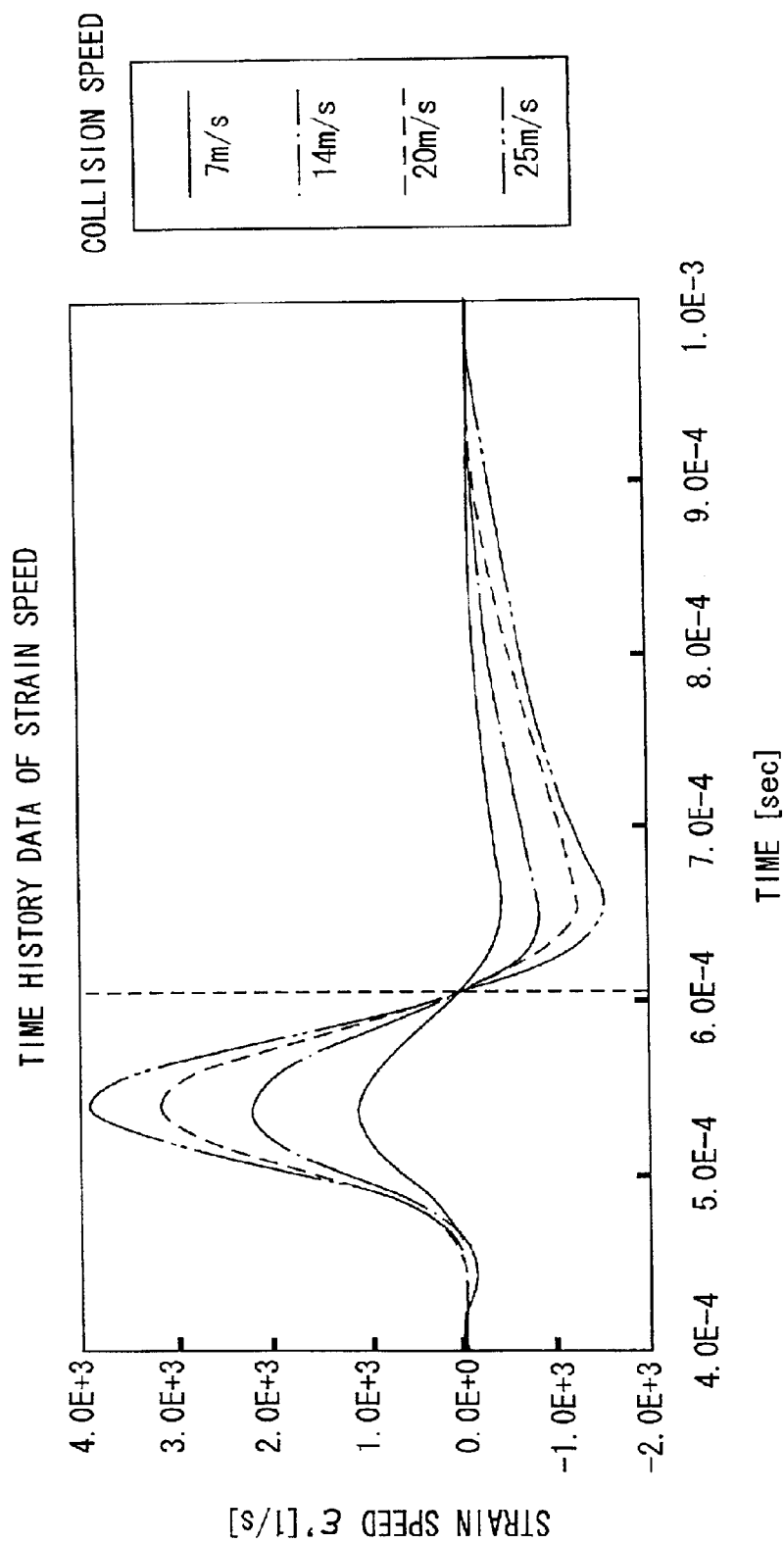
FIG. 2 shows time history data of a strain speed $\epsilon'$ in the first embodiment.
Figure 3:
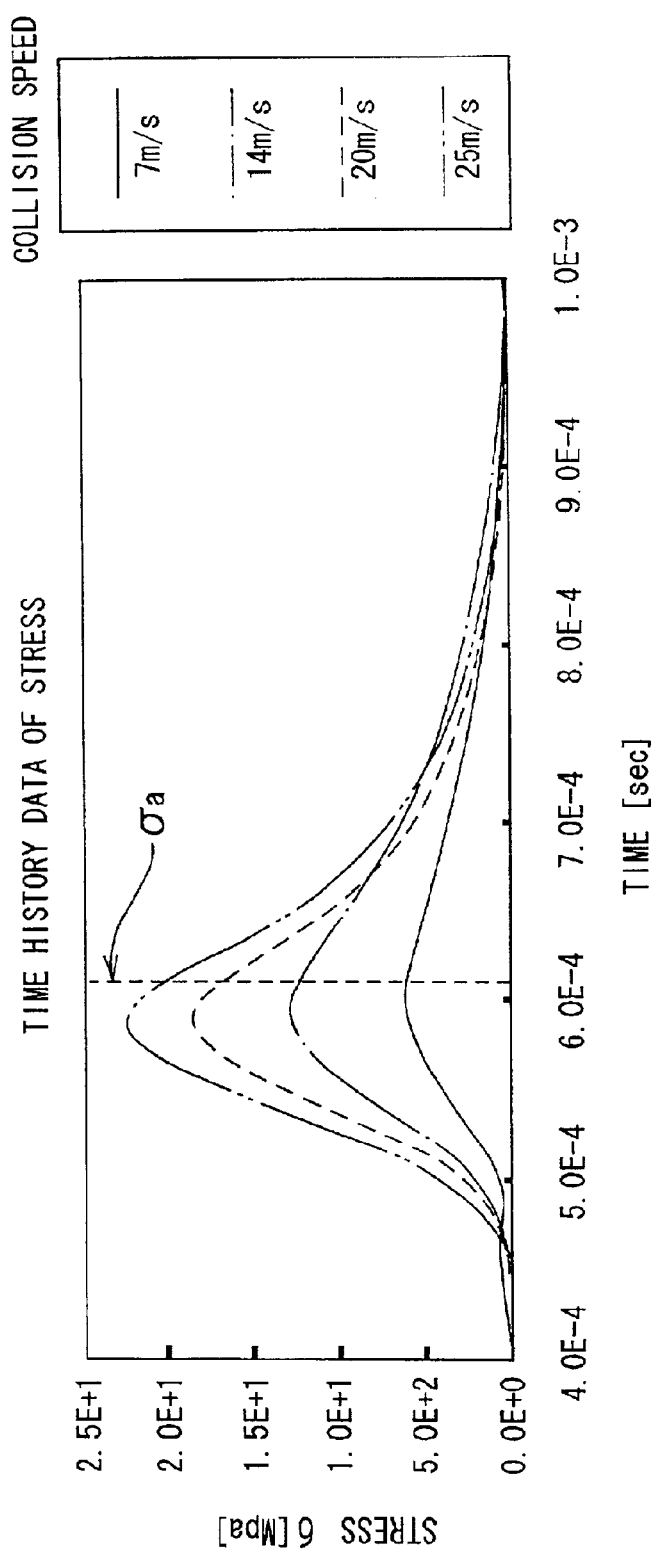
FIG. 3 shows time history data of a stress $\sigma$ in the first embodiment.

The split Hopkinson's bar tester is capable of measuring physical properties of the material in various regions of the strain and the strain speed by altering the collision speed of an impact bar. In the first embodiment, four different patterns of the collision speed (7 m/s, 14 m/s, 20 m/s, and 25 m/s) are adopted, and the physical properties of the material are measured in four different measuring conditions to obtain time history data of the strain, the strain speed, and the stress in each of the four collision patterns. FIGS. 1, 2, and 3 show the time history data of the strain $\epsilon$, the strain speed $\epsilon'$, and the stress $\sigma$ respectively.

Figure 4:
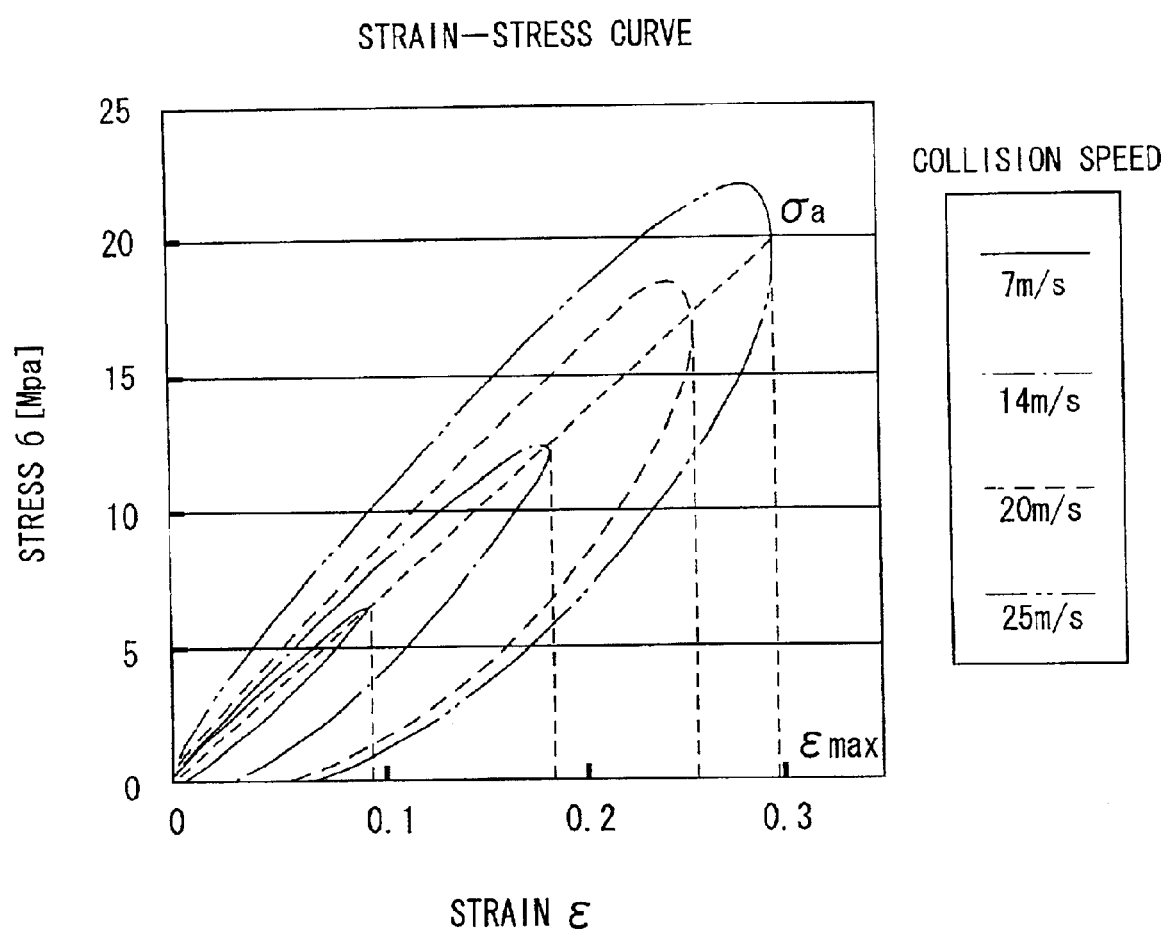
FIG. 4 shows a method of computing a strain-stress curve and a modulus of direct elasticity in the first embodiment.

FIG. 4 shows a strain-stress curve drawn on the basis of the time history data of the strain and the stress. With reference to the graph of FIG. 4, the modulus of direct elasticity E of the specimen in each of the collision patterns is computed by using the maximum strain value $\epsilon_{max}$ and the stress value $\sigma_a$ corresponding to the maximum strain value $\epsilon_{max}$ and by using an equation (1) shown below.
(Equation 1)

$$E=\sigma_a/\epsilon_{max} \quad (1)$$

In the case of the material containing the butadiene rubber as its main component in the first embodiment, even when the collision speed of the impact bar of the split Hopkinson's bar tester is altered, the specimen has the same modulus of direct elasticity in each collision pattern.

Figure 5:
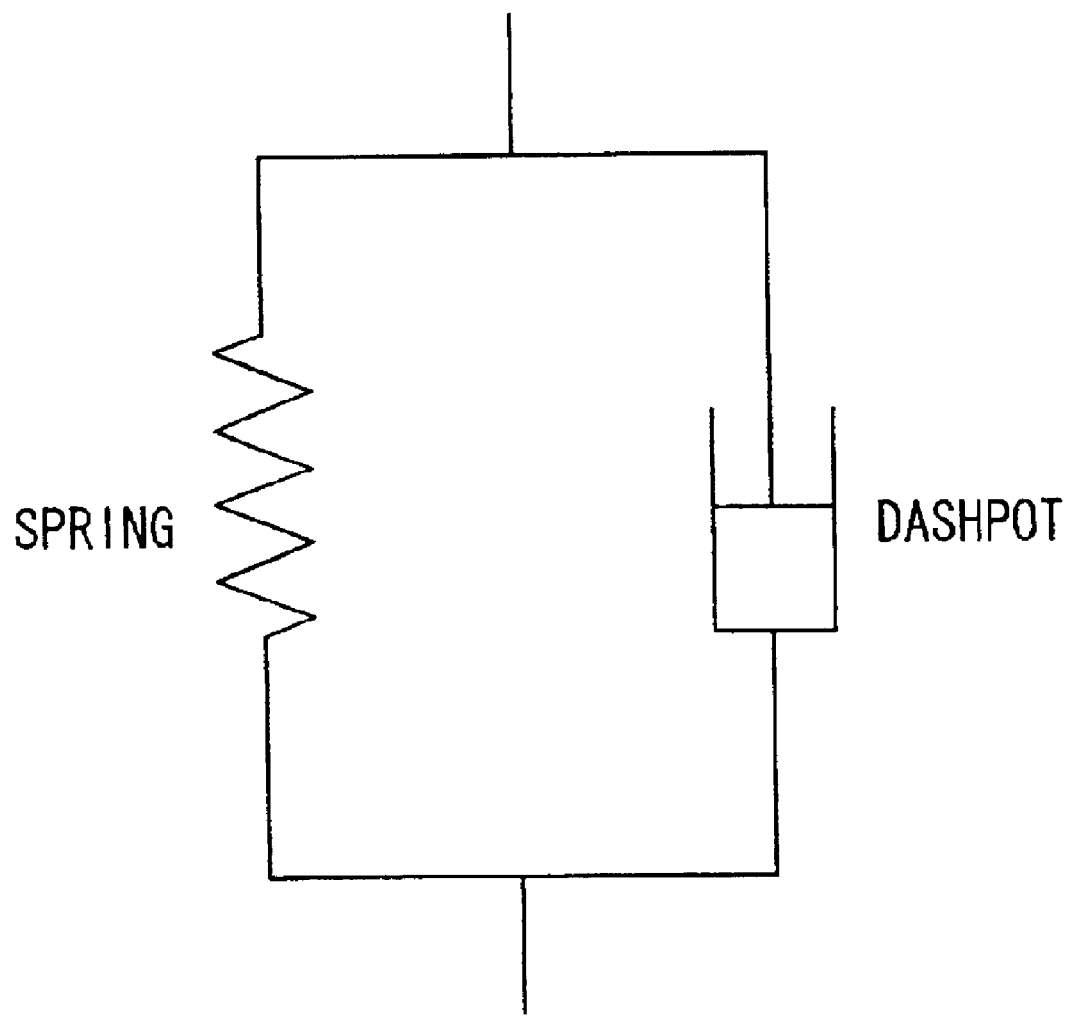
FIG. 5 shows a two-component Voight model used as a viscoelastic model of the first embodiment.

To conduct a simulation in consideration of the viscosity of a product made of the viscoelastic material, a viscoelastic model is set in consideration of the viscosity of the viscoelastic material. More specifically, in the embodiment, a fundamental two-component Voight model shown in FIG. 5 is used as the viscoelastic model consisting of a spring and a dashpot. That is, the viscoelastic material model is used in such a way that the viscosity resistance $\eta$ of the dashpot and the rigidity of the spring (modulus of direct elasticity E or shear coefficient) are variable.

As shown in FIG. 5, in the fundamental two-component Voight model used as the viscoelastic model, assuming that a stress generated in the spring is $\sigma_1$ and a stress generated in the dashpot is $\sigma_2$, a stress $\sigma$ generated by the entire viscoelastic model can be expressed by an equation (2) shown below:
(Equation 2)

$$\begin{aligned}\sigma &= \sigma_1 + \sigma_2 \\ &= E\varepsilon + \eta\varepsilon'\end{aligned} \quad (2)$$

Therefore from the equation (2), the viscosity resistance $\eta$ of the viscoelastic model is expressed by an equation (3) shown below:
(Equation 3)

$$\eta=(\sigma-E\epsilon)/\epsilon' \quad (3)$$

Figure 6:
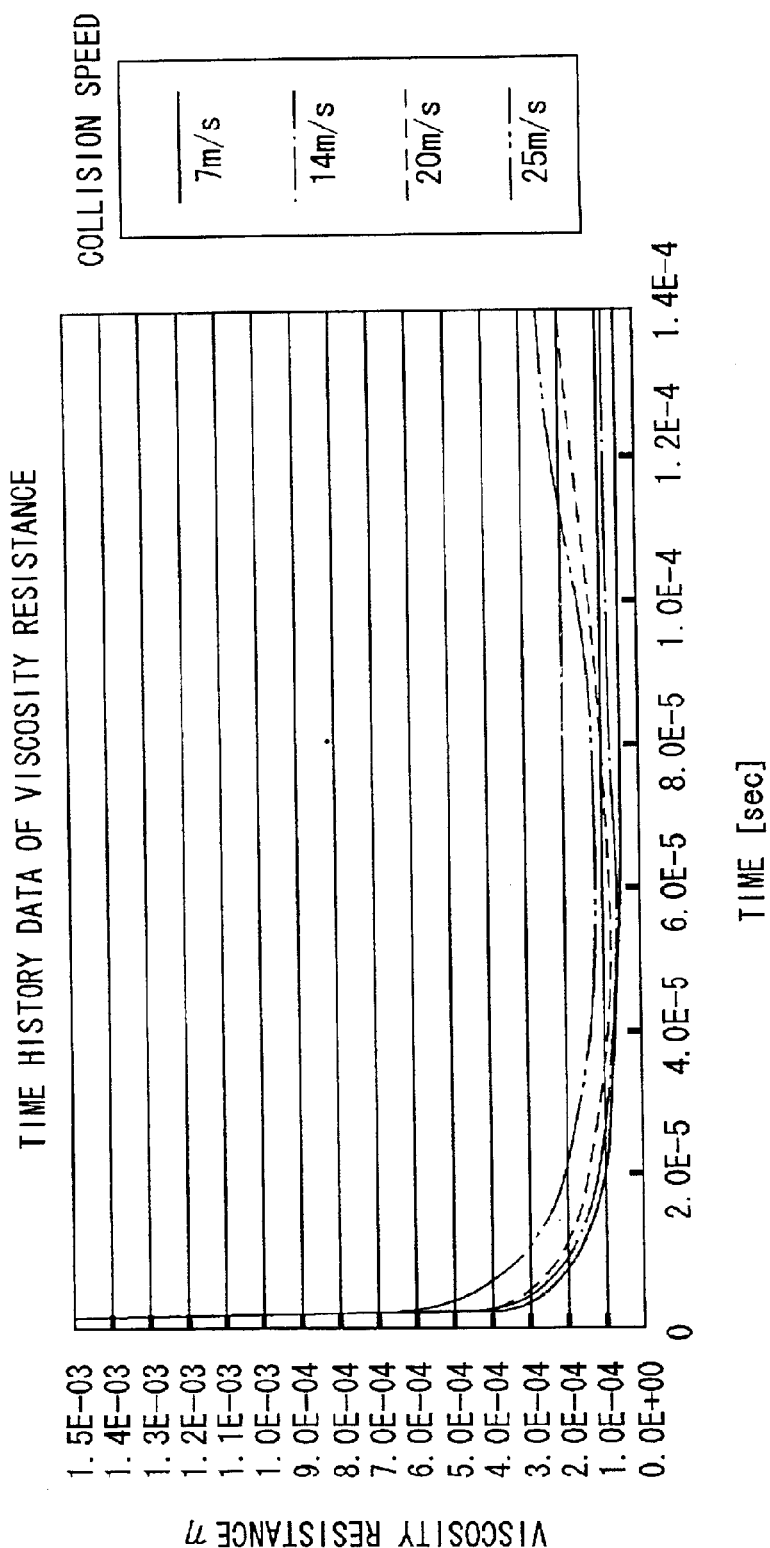
FIG. 6 shows time history data of a viscosity resistance in the first embodiment.

Therefore from the time history data of the strain $\epsilon$, the strain speed $\epsilon'$, and the stress $\sigma$ shown in FIGS. 1, 2, and 3 respectively and the equation (3), the viscosity resistance $\eta$ of the viscoelastic model corresponding to the strain $\epsilon$ as well as the strain speed $\epsilon'$ can be computed momently. FIG. 6 shows the obtained time history data of the viscosity resistance $\eta$ at each collision speed.

Based on the strain and the stress obtained by the measurement conducted under the condition in which the viscoelastic material deforms greatly at a high speed, its modulus of direct elasticity E is determined. Thereafter the viscosity resistance $\eta$ of the viscoelastic material is computed from the equation (3) derived from the viscoelastic model set in consideration of its viscosity. The obtained viscosity resistance $\eta$ is applied to the simulation.

Figure 7:
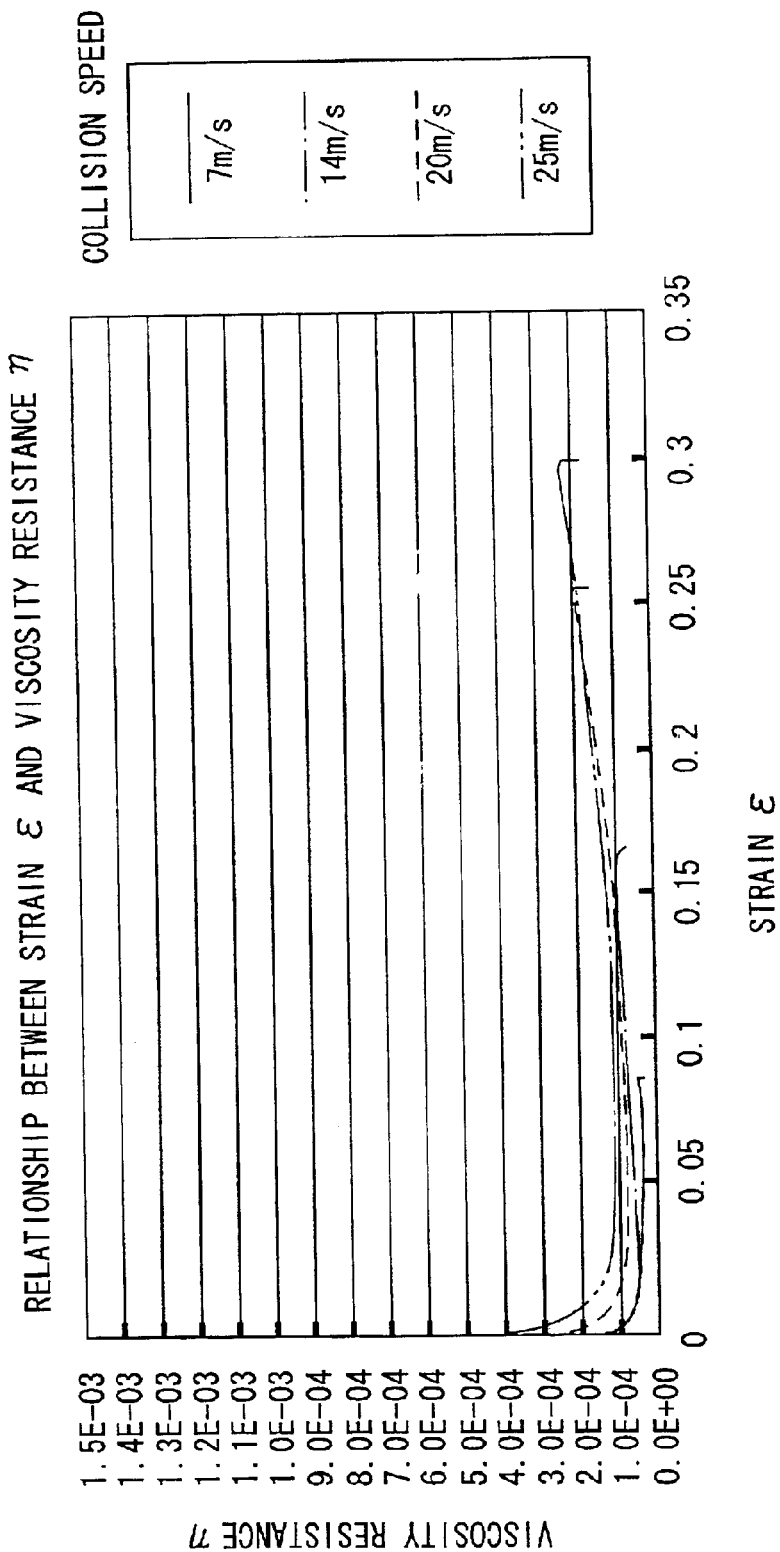
FIG. 7 shows the relationship between the strain and the viscosity resistance in the first embodiment.
Figure 8:
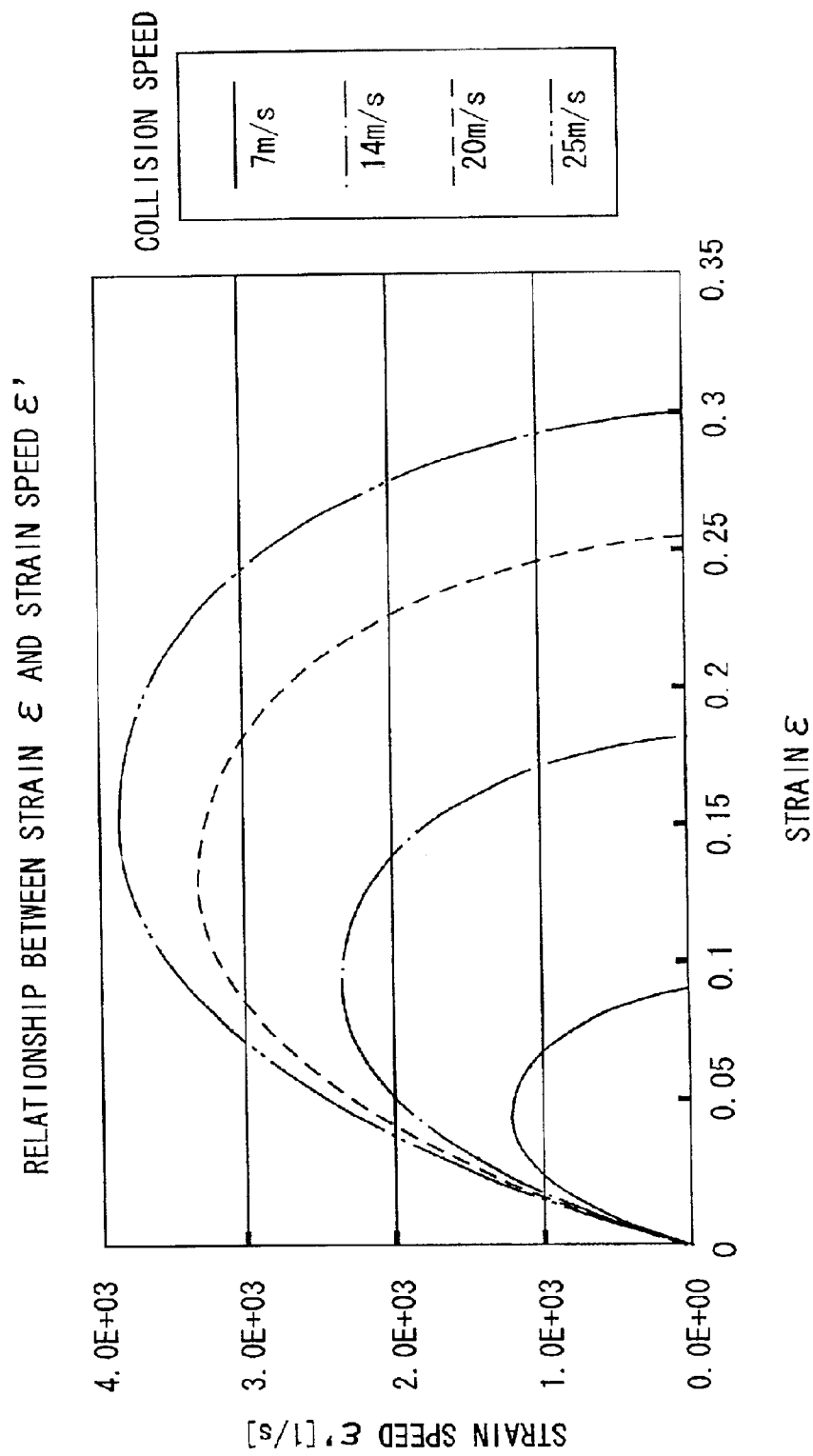
FIG. 8 shows the relationship between the strain and the strain speed in the first embodiment.

FIG. 7 shows the relationship between the strain $\epsilon$ and the viscosity resistance $\eta$ obtained from the time history data of the strain and the viscosity resistance. FIG. 8 shows the relationship between the strain $\epsilon$ and the strain speed $\epsilon'$ obtained from the time history data of the strain and the strain speed. Because the viscosity resistance n changes according to the strain $\epsilon$ and the strain speed $\epsilon'$ as shown in FIGS. 7 and 8, the viscosity resistance $\eta$ can be determined in dependence on the strain $\epsilon$ and the strain speed $\epsilon'$. That is, the viscosity resistance $\eta$ is the function of the strain $\epsilon$ and the strain speed $\epsilon'$.

The simulation is conducted by writing the relationship between the strain and the viscosity resistance shown in FIG. 7 and the relationship between the strain and the strain speed shown in FIG. 8 as input data in each collision speed, as will be described later and carrying out an analysis based on the finite element method in consideration of the change of the viscosity resistance which occurs in dependence on the variation of the strain and the strain speed.

Figure 9:
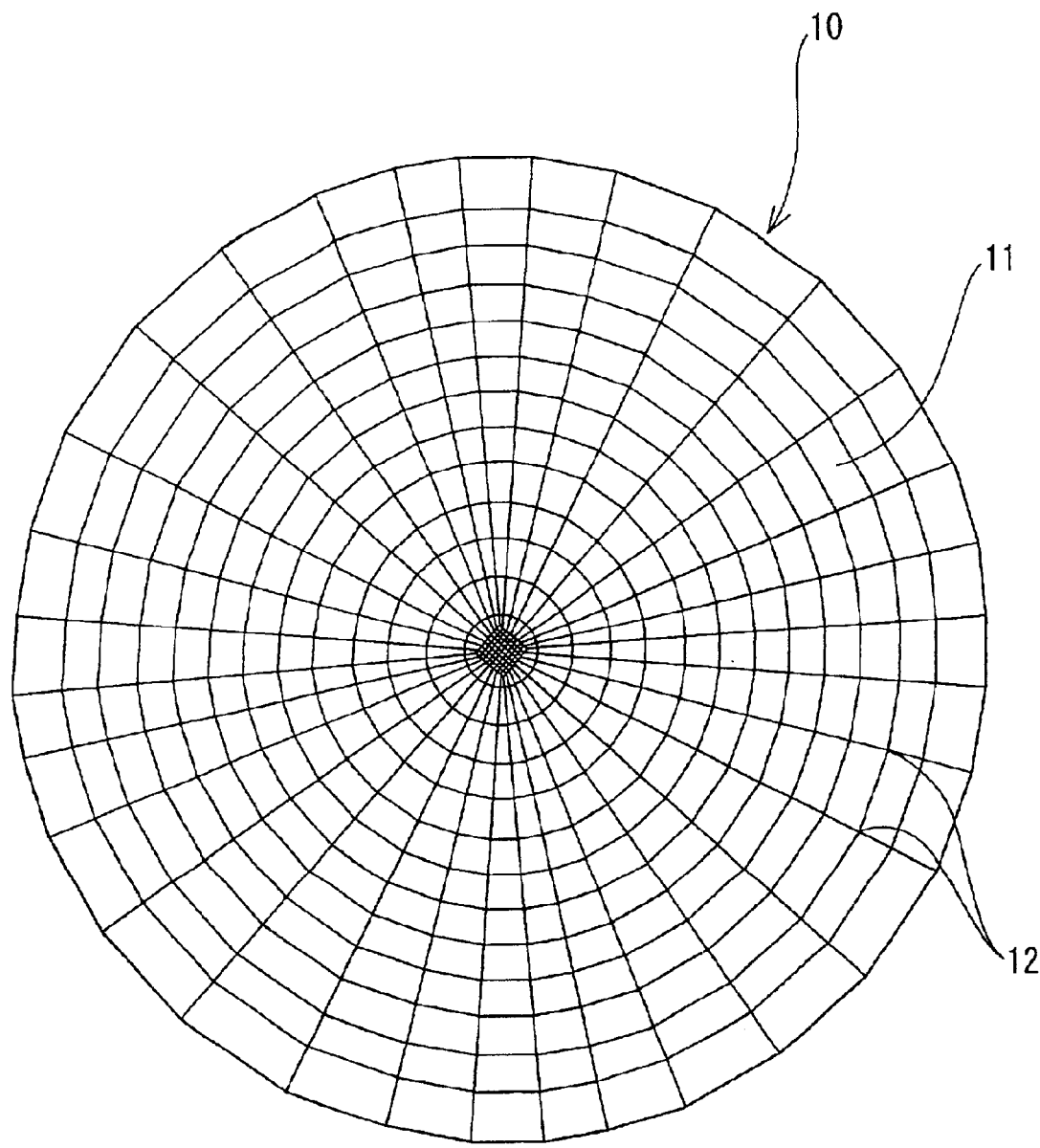
FIG. 9 shows a division situation of a golf ball model by means of meshes.

In the first embodiment, a golf ball model is set as a product model made of the viscoelastic material to conduct the simulation, assuming that a golf club head collides with the golf ball. As shown in FIG. 9, a golf ball model 10 is assumed to be a one-piece ball containing high-cis polybutadiene as its main component and having a diameter of 42.8 mm.

In executing the analysis based on the finite element method, an initial condition is set on the product model. That is, the initial condition of the size, configuration, construction, and the like of the golf ball model 10 is set, and the golf ball model 10 is divided into a large number of mesh elements 11 to obtain a large number of nodal points 12. The total number of the mesh elements of the golf ball model 10 is favorably 1000–100000 and more favorably 2500–20000. The upper limit value is set in view of the capability of a computer currently available. As the capability of the computer is improved, the time required to execute the analysis based on the finite element method is reduced. Thus needless to say, the upper limit value can be changed.

Based on the above-described set condition, the data of the golf ball model 10 and the relationship among the strain, the strain speed, and the viscosity resistance are written as the input data in computations to be performed in the simulation. When the computation is performed, an appropriate viscosity resistance is computed for each element momently from the equations, and the computations are performed by using the viscosity resistances. In the simulation of the first embodiment, two-dimensional data of the relationship between the strain and the strain speed and that of the relationship between the strain and the viscosity resistance are inputted to perform the computations. From time series data of the strain and the strain speed in each of the four patterns different from one another in measuring conditions, the correspondence relationship between the strain and the strain speed is recorded. The strain, the strain speed, and the viscosity resistance corresponding to the strain as well as the strain speed are also written as the input data. In the case of a strain and a strain speed not the same as the data of the strains and the strain speeds measured under the four different measuring conditions, a primary interpolation is performed by using a binary value of the viscosity resistance determined in dependence on a strain and a strain speed close to one of the strains and the strain speeds measured under the four different measuring conditions.

More specifically, information of a strain and a strain speed generated in one element is obtained by giving attention to the element. Thereafter based on the relationship between the strain and the strain speed obtained from measurement in each collision case (measurement case), reference is made to the value of the strain speed when the strain having an equal value is generated in each collision case. Then two collision cases each having the value of the strain speed close to the value of the strain speed of the attention-given element are searched. By using the value of each of the strain speed and the viscosity resistance when the values of the strains corresponding to the strain speeds of the two collision cases are equal to each other, the interpolation is performed to compute an appropriate value of the viscosity resistance corresponding to the strain and the strain speed generated in the attention-given element. That is, in the first embodiment, the primary interpolation is performed. By determining the viscosity resistance of each element in dependence on the strain and the strain speed generated therein, the physical property of the viscoelastic material of each element is expressed for each element at an appropriate strain and strain speed.

Figure 10A:
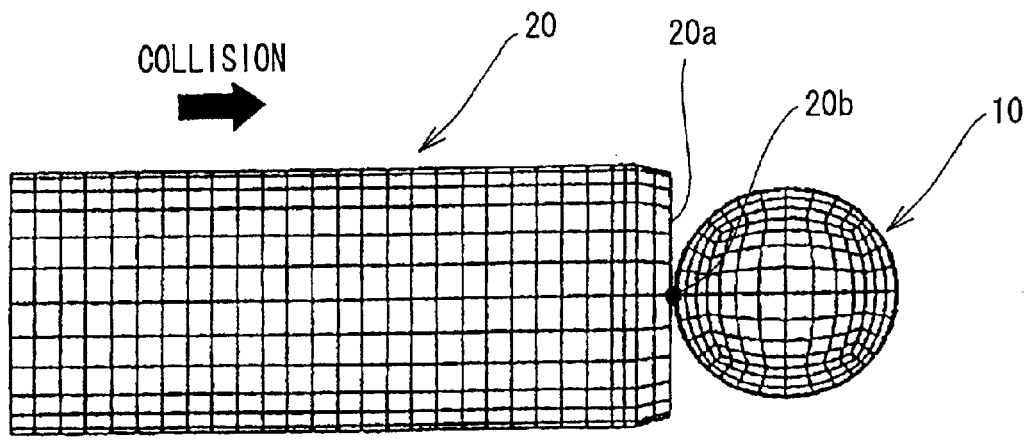
FIG. 10A shows a situation before a hollow rod model made of aluminum collides with a golf ball model.
Figure 10B:
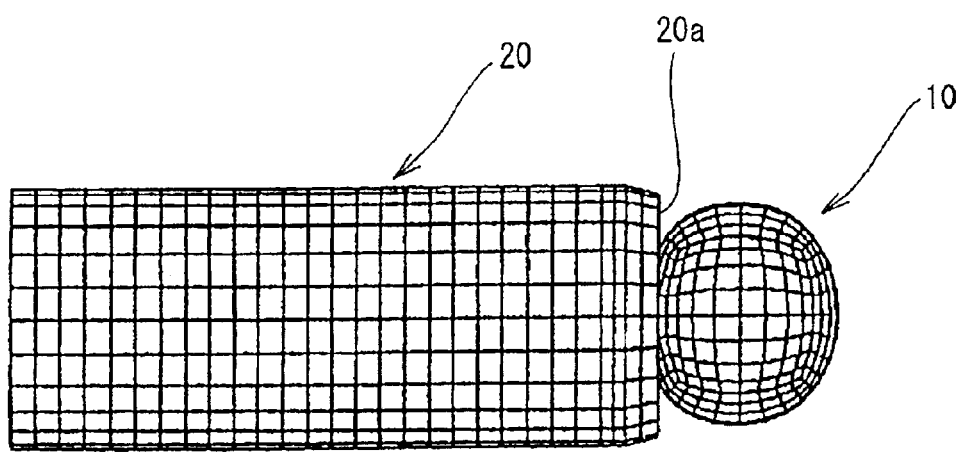
FIG. 10B shows a situation when the hollow rod model has collided with the golf ball model.
Figure 10C:
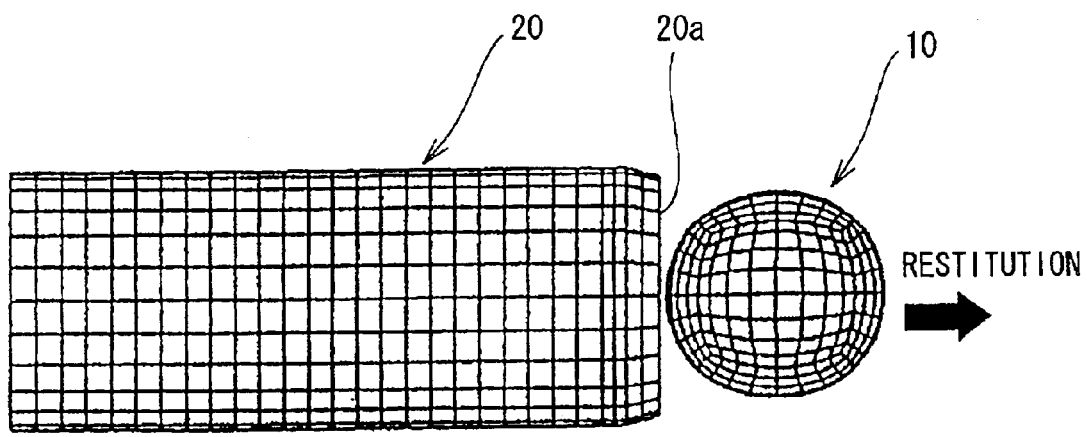
FIG. 10C shows a situation after the hollow rod model collides with the golf ball model.

More specifically, as shown in FIGS. 10A, 10B, and 10C, a simulation is conducted by analyzing the physical property of the material for the golf ball model 10 by the finite element method, when a cylindrical hollow rod model 20 made of aluminum having a weight of 200 g (same as the weight of a golf club head) collides with the golf ball model 10 at a speed of 45 m/s. Thereby a computation is performed to find the amount of a strain generated in each element 11 of the golf ball model 10 in a predetermined period of time from a time of collision between the golf ball model 10 and the cylindrical hollow rod model 20.

A mass is distributed to each of nodal points constituting one element. Each nodal point is replaced with a material point. The speed of each nodal point is regarded as the speed of the material point. Thus the speeds of all the nodal points are divided by the number of the nodal points to find the speed of one element. That is, the speed Vbi (i=x, y, z) of the impacted ball is found as follows by an equation (4) shown below. The entire momentum of the ball is regarded as the sum of the momentums of all the material points. Thus a value obtained by dividing all the momentums of all the material points by the total weight thereof is defined as the launching speed Vbi of the ball.

(Equation 4)

$$v_{bi} = \frac{\sum_{n=1}^{N} m_n v_{ni}}{M} \qquad (4)$$

where N is the number of the nodal points, M is the total mass, Vni is an n-th translation speed, and Mn is the value obtained by dividing the mass of an element including the nodal points by the number of the nodal points included in the element.

The cylindrical hollow rod model 20 made of aluminum collides with the golf ball model 10 at a circular surface 20a thereof. The collision surface of the cylindrical hollow rod model 20 is flat. The cylindrical hollow rod model 20 collides head-on with the golf ball model 10. A central point 20b of the circular surface 20a of the cylindrical hollow rod model 20 collides first with the golf ball model 10.

The speed of the cylindrical hollow rod model 20 and that of the golf ball model 10 before and after the collision therebetween are computed by using the above-described method. The restitution coefficient of the golf ball model 10 is found from the speed and weight of each of the cylindrical hollow rod model 20 and the golf ball model 10 to estimate the performance of the golf ball model 10.

As described above, the simulation is conducted by determining the viscosity resistance as the function of the strain and the strain speed, inputting the relationship among the strain, the strain speed, and the viscosity resistance to the golf ball model, and carrying out the analysis based on the finite element method. Therefore it is possible to compute the viscosity resistance corresponding to the strain and the strain speed of each element momently from the strain and the strain speed and estimate with high precision the characteristic of the viscoelastic material having nonlinearity in the condition in which the golf ball model deforms greatly at a high speed.

Therefore in a condition equivalent to a condition in which a golf ball is hit with an actual golf club head, it is possible to correctly apprehend the performance such as the restitution coefficient of the golf ball model made of the viscoelastic material, its dynamic behavior, and the like without making the golf ball as an experiment.

Figure 11:
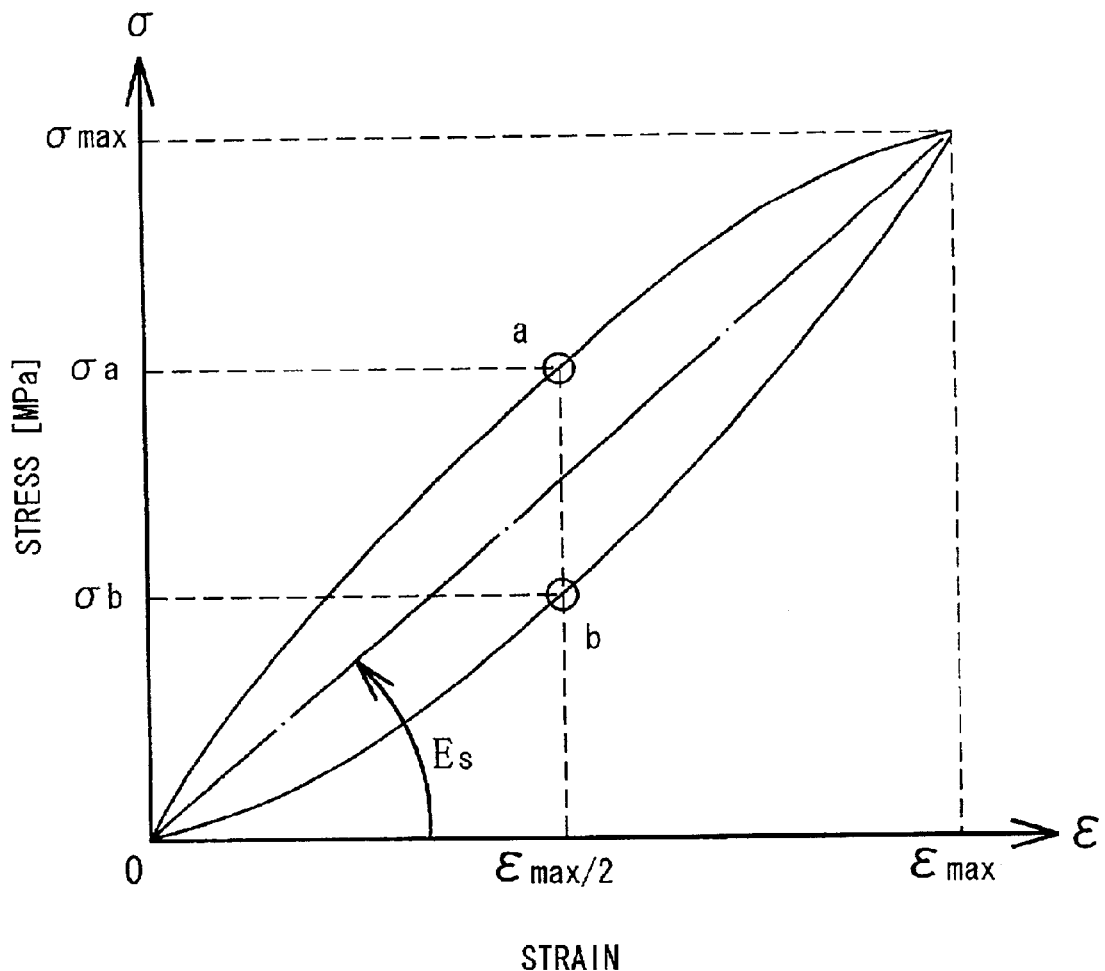
FIG. 11 shows a method of computing a loss factor.

From a stress-strain curve of FIG. 11, a phase angle δ is found by using an equation (5) shown below. A loss factor (tan δ) can be found from the phase angle δ.

(Equation 5)

$$\delta = \sin^{-1}((\sigma_a - \sigma_b)/\sigma_{max}) \qquad (5)$$

In the simulation method according to the second embodiment of the present invention, as a viscoelastic material showing nonlinearity, a golf ball-composing material containing urethane rubber as its main component is used. A split Hopkinson's bar tester improved in its construction to measure the viscoelastic material measures the value of each of a strain, a strain speed, and a stress generated in a specimen consisting of the viscoelastic material used as a specimen containing the urethane rubber as its main component momently in a condition in which a golf ball is assumed to deform greatly at a high speed in an actual use state. The measuring method carried out by the split Hopkinson's bar tester will be described later.

Figure 12:
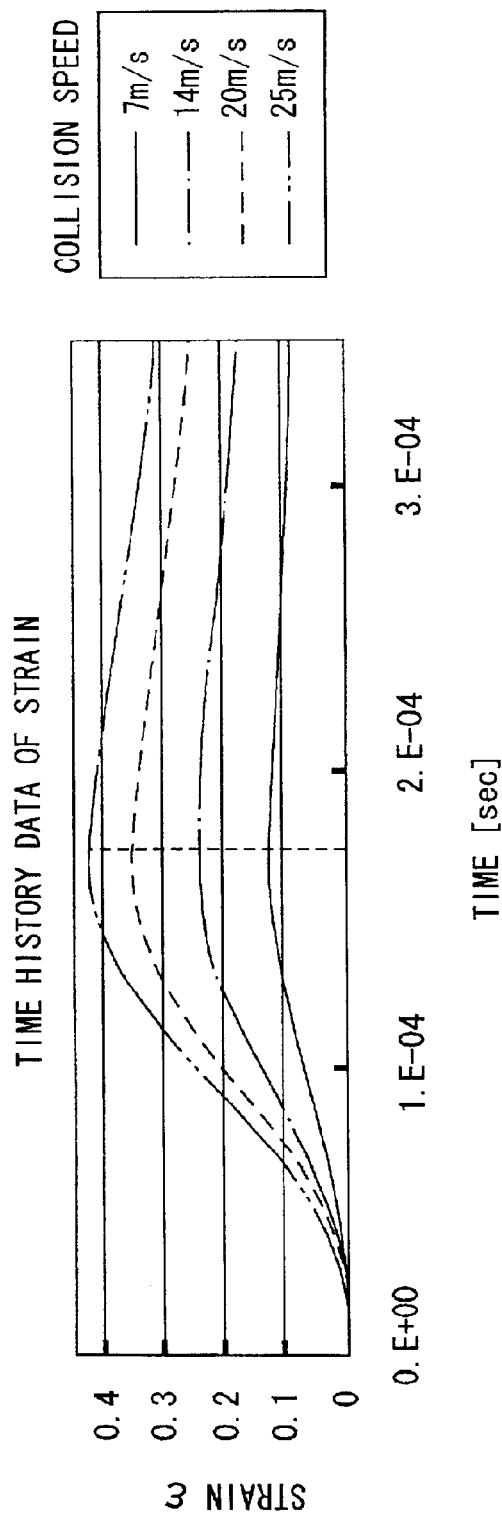
FIG. 12 shows time history data of a strain $\epsilon$ in a second embodiment of the present invention.
Figure 13:
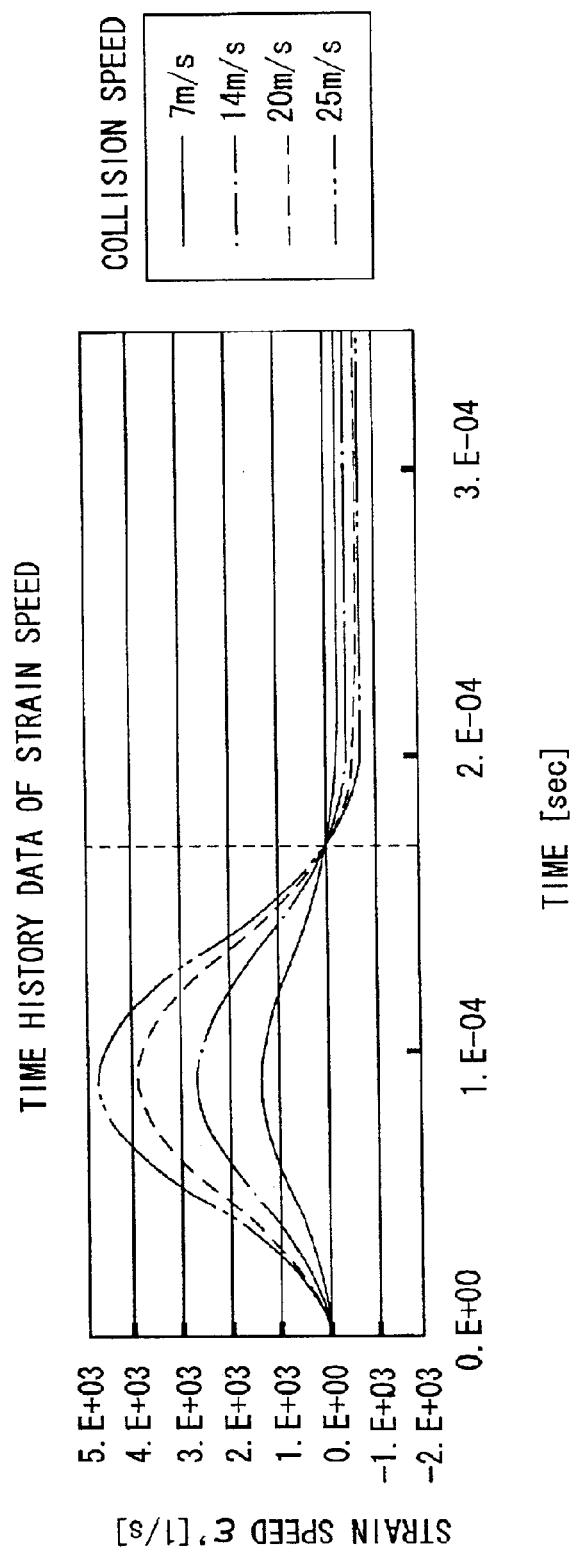
FIG. 13 shows time history data of a strain speed $\epsilon'$ in the second embodiment.
Figure 14:
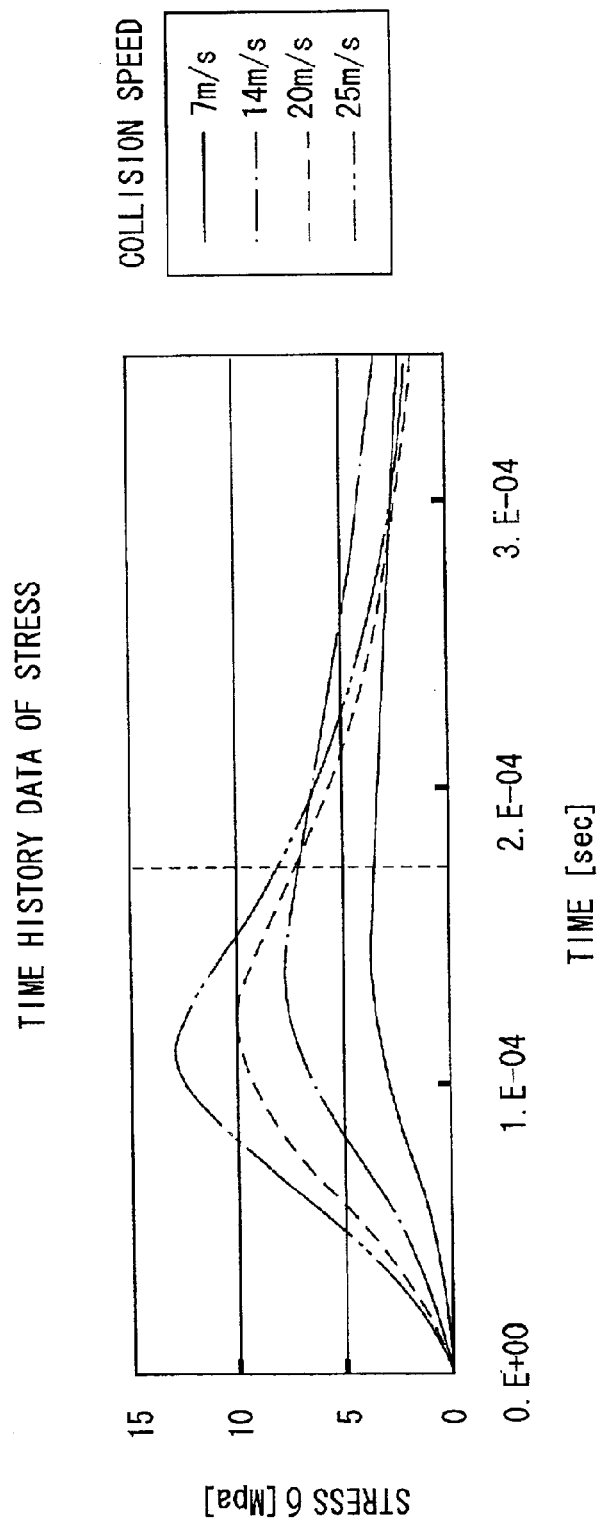
FIG. 14 shows time history data of a stress $\sigma$ in the second embodiment.

In the second embodiment, four different patterns of the collision speed (7 m/s, 14 m/s, 20 m/s, and 25 m/s) are adopted, and the physical properties of the material are measured in four different measuring conditions to obtain time history data of the strain, the strain speed, and the stress in each of the four collision patterns. FIGS. 12, 13, and 14 show the time history data of the strain $\epsilon$, the strain speed $\epsilon'$, and the stress $\sigma$ in each of the four collision patterns respectively.

Figure 15:
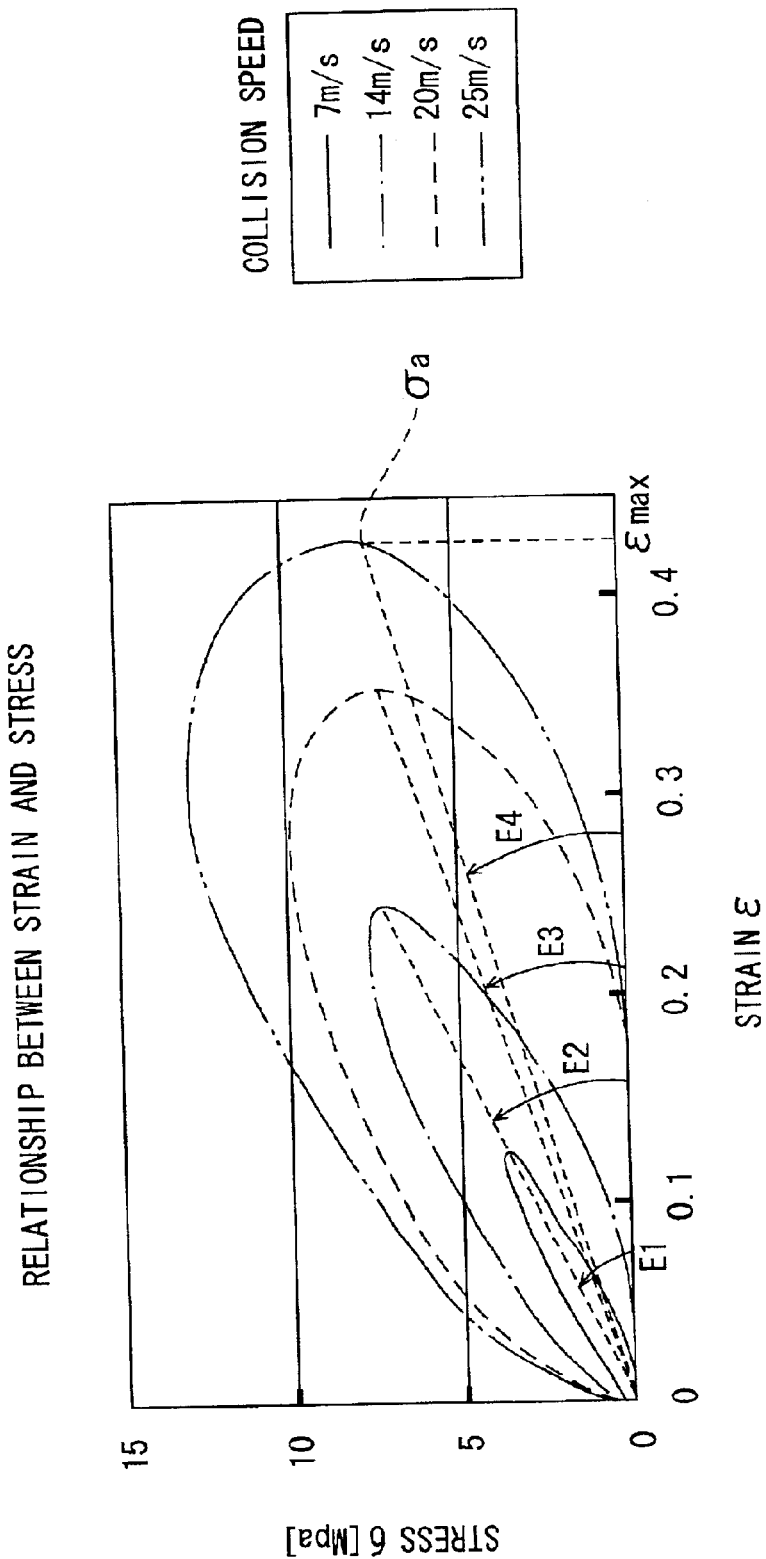
FIG. 15 shows a method of computing a strain-stress curve and a modulus of direct elasticity in the second embodiment.

FIG. 15 shows a strain-stress curve drawn on the basis of the time history data of the strain and the stress. With reference to the graph of FIG. 15, the maximum strain value $\epsilon_{max}$ and the stress value $\sigma_a$ corresponding to the maximum strain value $\epsilon_{max}$ are substituted into the equation (1) to find the modulus of direct elasticity E of the specimen in each collision pattern. As shown in FIG. 15, the modulus of direct elasticity E at each collision speed is E1, E2, E3, and E4.

Similarly to the first embodiment, in the second embodiment, a viscoelastic model consisting of a spring and a dashpot as shown in FIG. 5 is used to find the viscosity resistance $\eta$ of the viscoelastic model from the equations (2) and (3).

Figure 16:
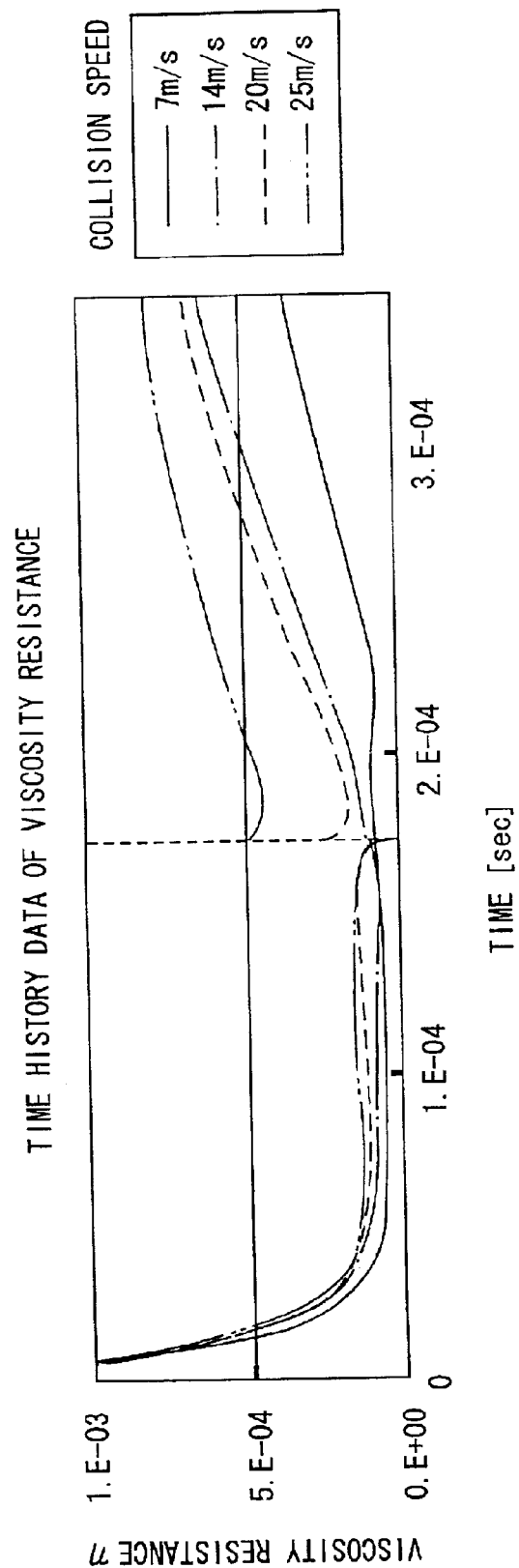
FIG. 16 shows time history data of a viscosity resistance in the second embodiment.

Therefore from the time history data of the strain $\epsilon$, the strain speed $\epsilon'$, and the stress a shown in FIGS. 12, 13, and 14 respectively, the modulus of direct elasticity E corresponding to the strain $\epsilon$ as well as the strain speed $\epsilon'$, and the equation (3), it is possible to find the viscosity resistance $\eta$ of the viscoelastic model momently in consideration of the modulus of direct elasticity E which changes in correspondence to a variation of the strain $\epsilon$ and the strain speed $\epsilon'$, as shown in FIG. 16.

Based on the strain and the stress obtained by the measurement conducted under the condition in which the viscoelastic material deforms greatly at a high speed, its modulus of direct elasticity E in each condition is determined. Thereafter the relationship among the strain, the strain speed, and the modulus of direct elasticity is properly adjusted. Then the viscosity resistance $\eta$ of the viscoelastic material is computed from the equation (3) derived from the viscoelastic model set in consideration of its viscosity. The obtained viscosity resistance $\eta$ is applied to the simulation.

More specifically, the simulation is conducted by writing the relationship between the strain, the strain speed, and the modulus of direct elasticity and the relationship between the strain, the strain speed, and the viscosity resistance as input data in each collision speed, as will be described later and by carrying out a analysis based on the finite element method with reference to the change of the modulus of direct elasticity and in consideration of the phenomenon that the viscosity resistance changes in dependence on the variation of the strain and the strain speed.

Similarly to the first embodiment, in the second embodiment, a one-piece ball containing urethane rubber as its main component is set as a product model 10 made of the viscoelastic material to conduct a simulation, assuming that a golf club head collides with a golf ball.

Based on a set condition similar to that of the first embodiment, the relationship among the strain, the strain speed, the modulus of direct elasticity, and the viscosity resistance and the data of the golf ball model 10 are written as the input data in a computation which is executed in the simulation. When the computation is performed, an appropriate modulus of direct elasticity of each element is computed momently from the equations, and the computations are performed by using the modulus of direct elasticity. In the simulation of the second embodiment, from time series data of the strain, the strain speed, and the stress in each of the four patterns different from one another in measuring conditions, the correspondence relationship, shown in FIG. 17, among the strain, the strain speed, and the modulus of direct elasticity is recorded. The strain, the strain speed, and the modulus of direct elasticity corresponding to the strain as well as the strain speed are also written as the input data. In the case of a strain and a strain speed not the same as the data of the strains and the strain speeds measured under the four different measuring conditions, a primary interpolation is performed by using a binary value of the modulus of direct elasticity determined in dependence on a strain and a strain speed close to one of the strains and the strain speeds measured under the four different measuring conditions.

Figure 17:
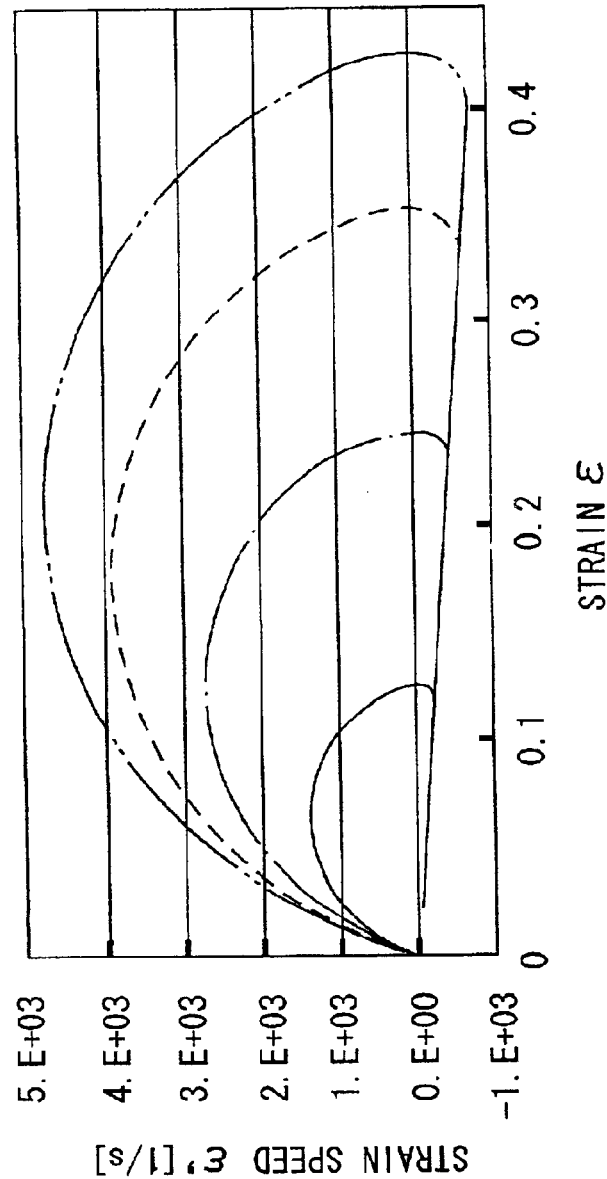
FIG. 17 shows the relationship between the strain and the strain speed in the second embodiment.

In FIG. 17, the curves indicating the strain speed $\epsilon'$ measured in the different conditions seem to overlap each other and have an equal value in the negative region thereof. However the curves have different strain speeds $\epsilon'$. Thus the modulus of direct elasticity can be determined from a binary value of the strain and that of the strain speed.

By determining the modulus of direct elasticity of each element in dependence on the strain and the strain speed generated therein, the physical property of the viscoelastic material of each element is expressed for each element at an appropriate strain and strain speed.

The speed of the cylindrical hollow rod model 20 and that of the golf ball model 10 before and after the collision therebetween are computed by using a method similar to that of the first embodiment. The restitution coefficient of the golf ball model 10 is found from the speed and weight of each of the cylindrical hollow rod model 20 and the golf ball model 10 to estimate the performance of the golf ball model 10.

As described above, the simulation is conducted by determining the modulus of direct elasticity as the function of the strain and the strain speed, inputting the relationship among the strain, the strain speed, and the modulus of direct elasticity to the golf ball model, and carrying out the analysis based on the finite element method. Therefore it is possible to compute the modulus of direct elasticity corresponding to the strain and the strain speed of each element momently from the strain and the strain speed and estimate with high precision the characteristic of the viscoelastic material having nonlinearity in the condition in which the golf ball model deforms greatly at a high speed.

Figure 18:
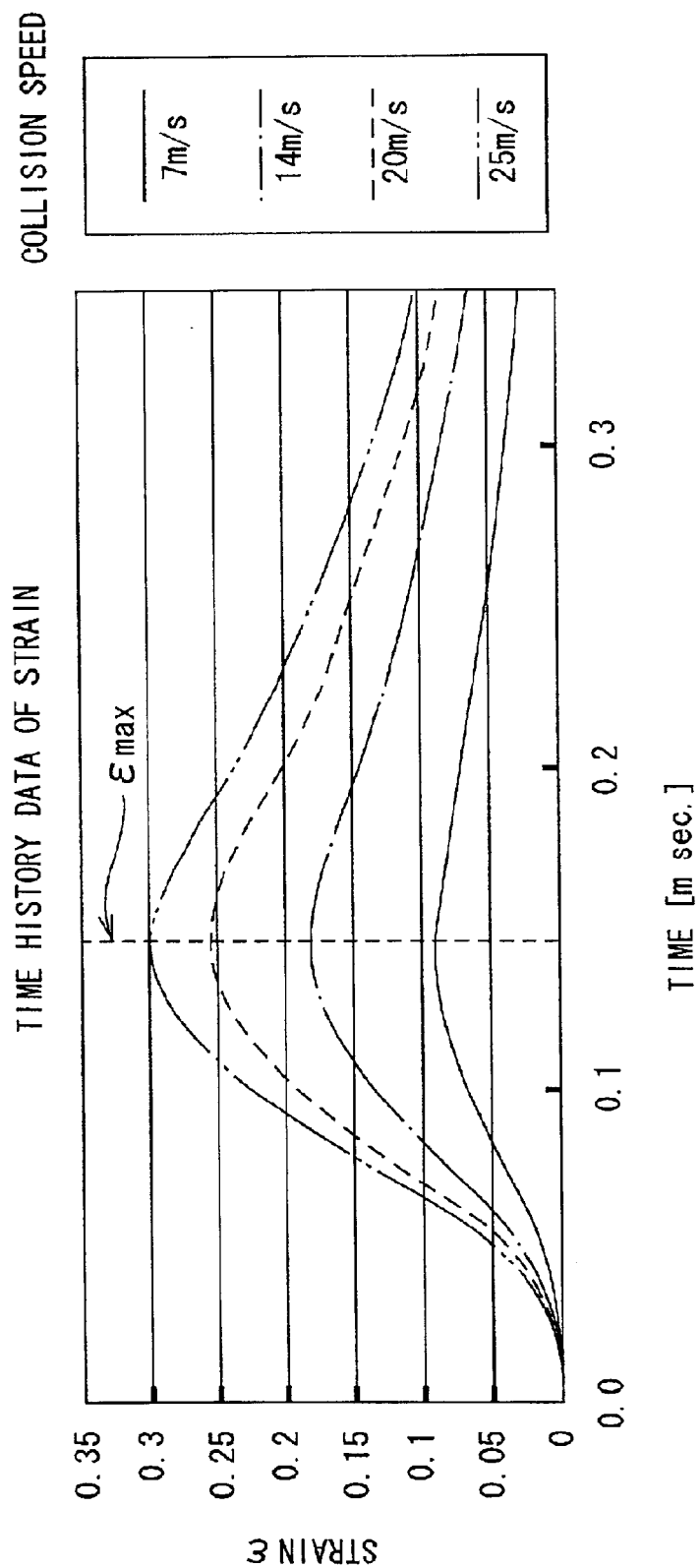
FIG. 18 shows time history data of a strain $\epsilon$ in a third embodiment of the present invention.
Figure 19:
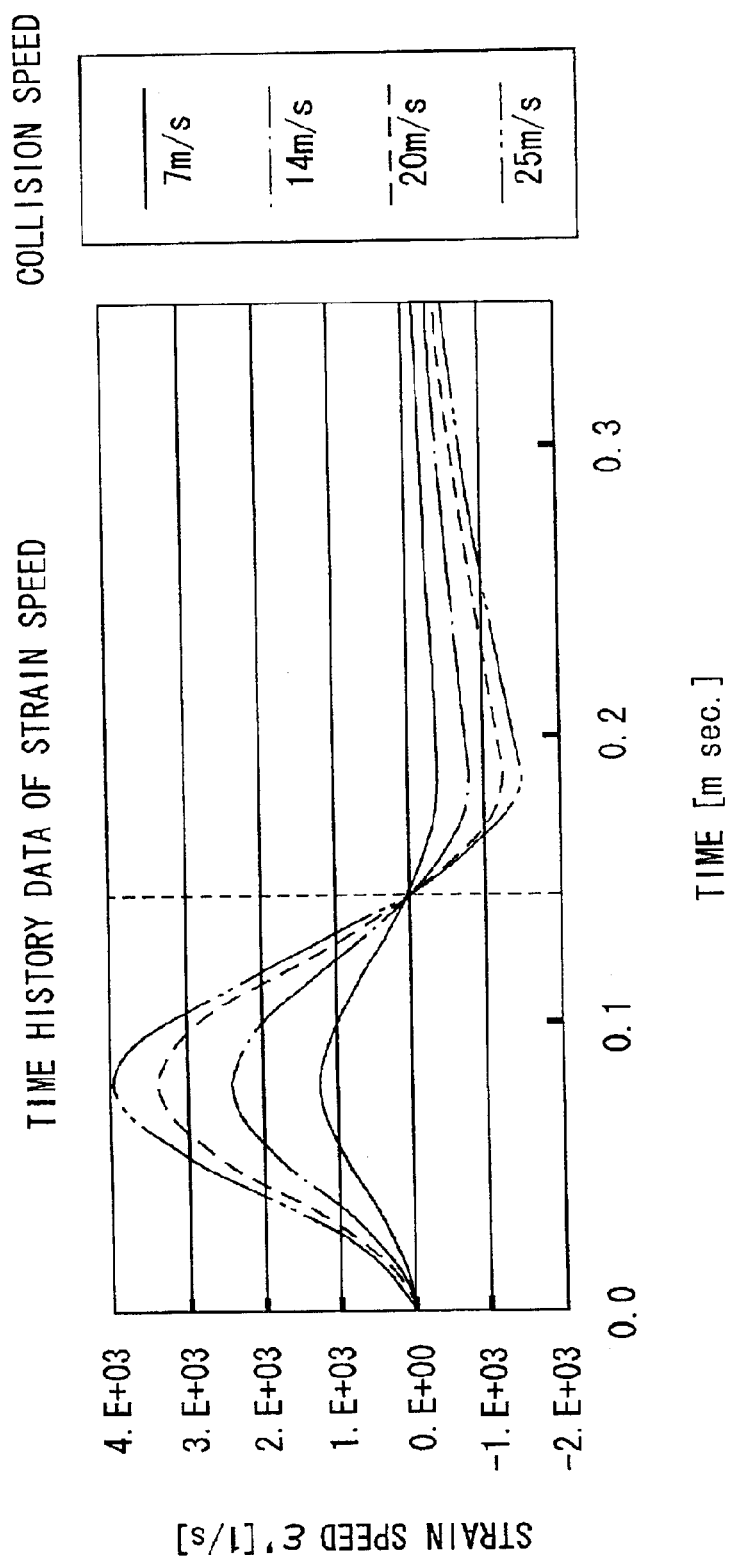
FIG. 19 shows time history data of a strain speed $\epsilon'$ in the third embodiment.
Figure 20:
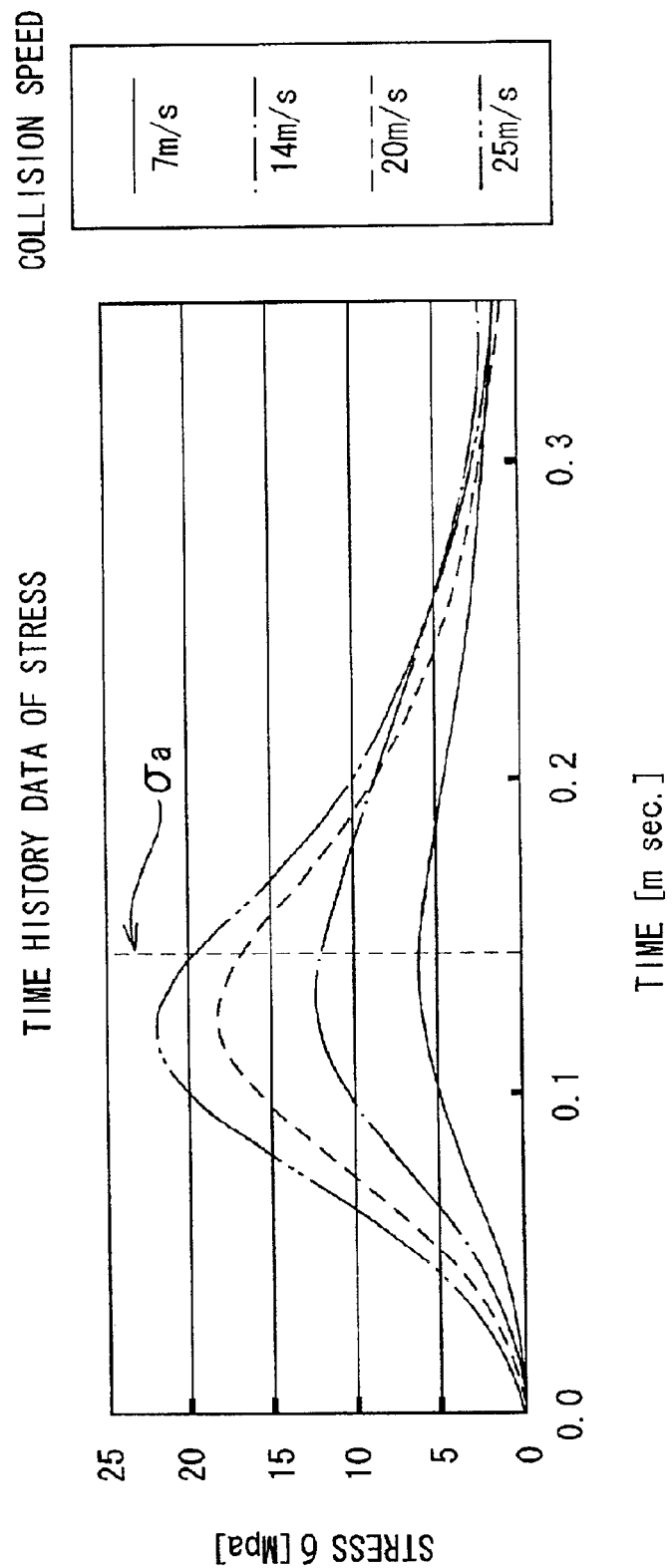
FIG. 20 shows time history data of a stress $\sigma$ in the third embodiment.

Similarly to the first embodiment, in the simulation method of the third embodiment, the value of each a strain, a strain speed, and a stress generated in the material containing butadiene rubber as its main component is measured momently. FIGS. 18, 19, and 20 show the time history data of each of the strain $\epsilon$, the strain speed $\epsilon'$, and the stress $\sigma$ in each of the four different collision patterns respectively.

As shown in FIG. 18, after the impact bar collides with a ball by using the split Hopkinson's bar tester, the material containing butadiene rubber as its main component generates a strain. The value of the strain increases in a certain period of time and then decreases gently. As shown in FIG. 19, the strain speed shows positive values until the strain attains a maximum value, and then shows negative values.

As shown in FIG. 20, the value of the stress changes with the elapse of time.

Figure 21:
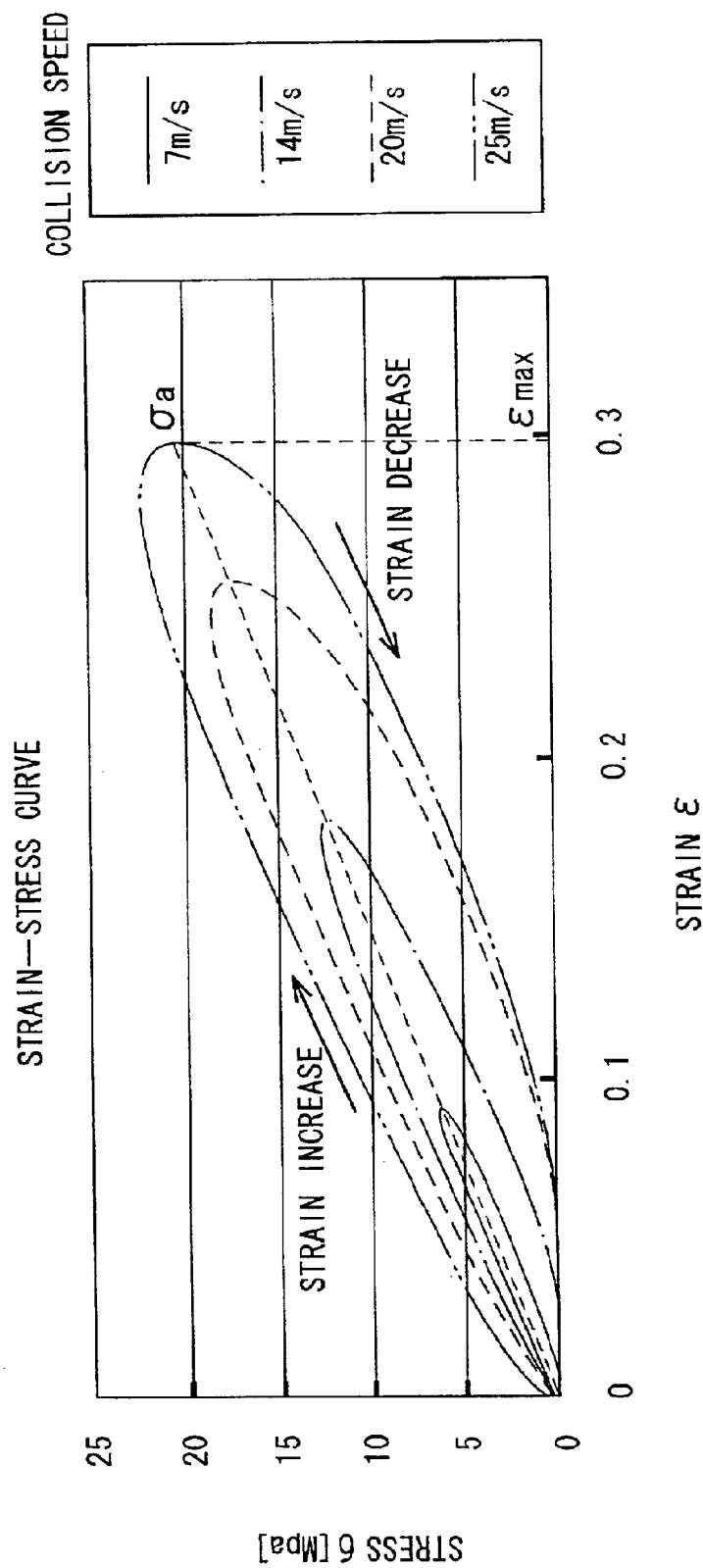
FIG. 21 shows a method of computing a strain-stress curve and a modulus of direct elasticity in the third embodiment.

FIG. 21 shows a strain-stress curve drawn on the basis of the time history data of the strain and the stress. With reference to the graph of FIG. 21, the modulus of direct elasticity E of the specimen in each of the collision patterns is computed by using the maximum strain value $\epsilon_{max}$ and the stress value $\sigma_a$ corresponding to the maximum strain value $\xi_{max}$ and the equation (1).

Similarly to the first embodiment, in the third embodiment, a viscoelastic model consisting of a spring and a dashpot as shown in FIG. 5 is used to find the viscosity resistance $\eta$ of the viscoelastic model from the equations (2) and (3).

Figure 22:
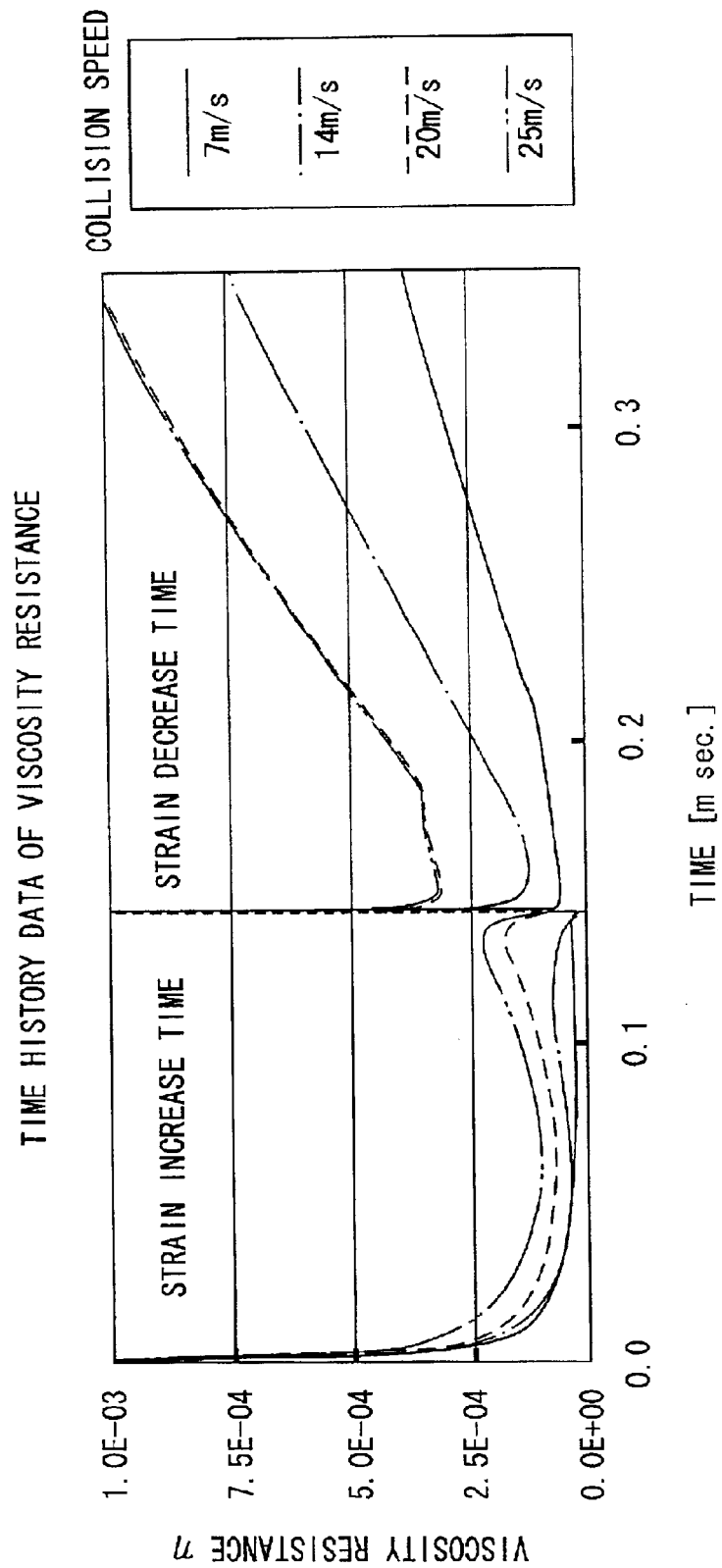
FIG. 22 shows time history data of a viscosity resistance in the third embodiment.

Therefore from the time history data of the strain $\epsilon$, the strain speed $\epsilon'$, and the stress a shown in FIGS. 18, 19, and 20 respectively and the equation (3), the viscosity resistance $\eta$ of the viscoelastic model corresponding to the strain $\epsilon$ as well as the strain speed $\epsilon'$ can be computed momently. As described above, the value of each of the strain, the strain speed, and the stress changes with the elapse of time. The state of the strain generated in the viscoelastic material can be divided into a "strain increase state" in which the strain increases in the compression direction thereof and a "restoration state" in which the compression amount thereof decreases gradually. Therefore the viscosity resistance is computed separately in each of the strain increase state and the strain decrease state (or restoration state) to obtain the time history data of the viscosity resistance at each of the collision speeds, as shown in FIG. 22.

Based on the strain and the stress obtained by the measurement conducted under the condition in which the viscoelastic material deforms greatly at a high speed, its modulus of direct elasticity E is determined. Then by using the equation (3) derived from the viscoelastic model set in consideration of its viscosity, the viscosity resistance $\eta$ of the viscoelastic material is computed separately in each of the strain increase state and the strain decrease state (or restoration state). The obtained viscosity resistance $\eta$ is applied to the simulation.

Figure 23:
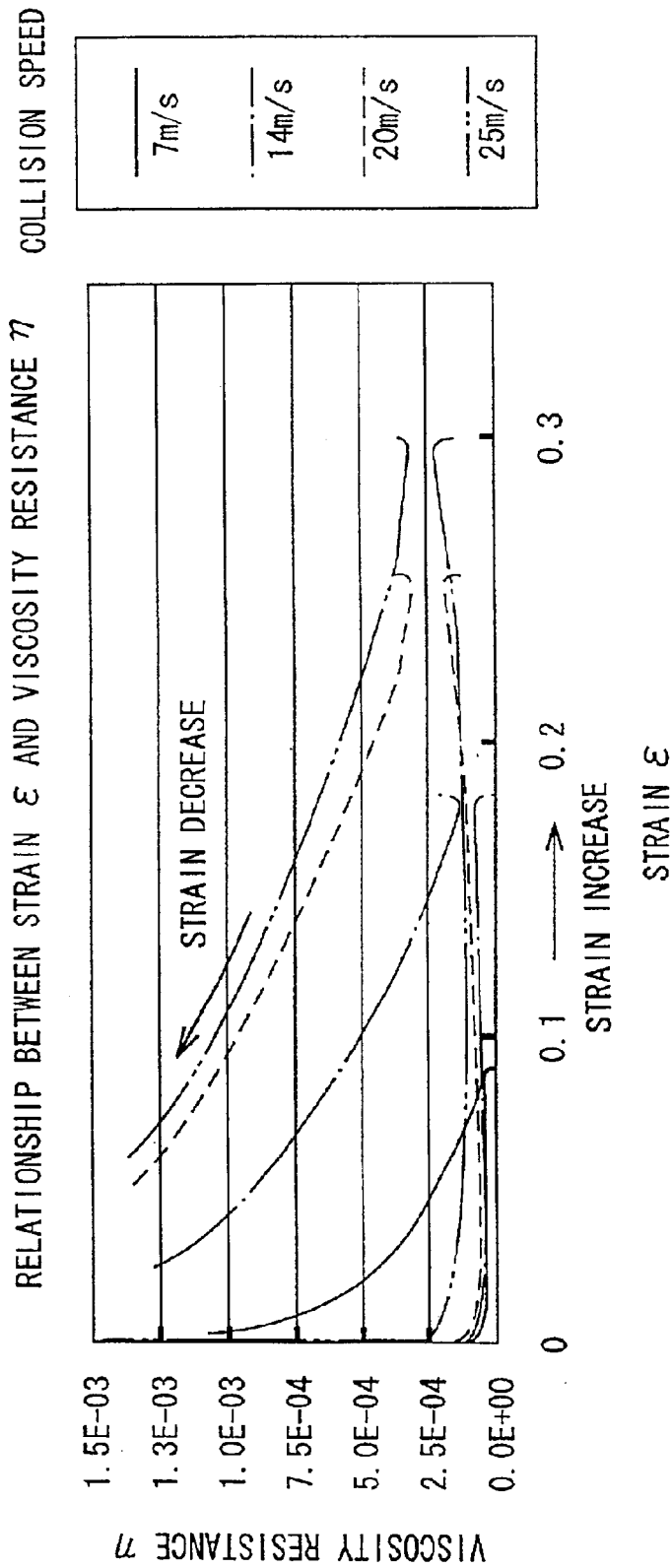
FIG. 23 shows the relationship between the strain and the viscosity resistance in the third embodiment.
Figure 24:
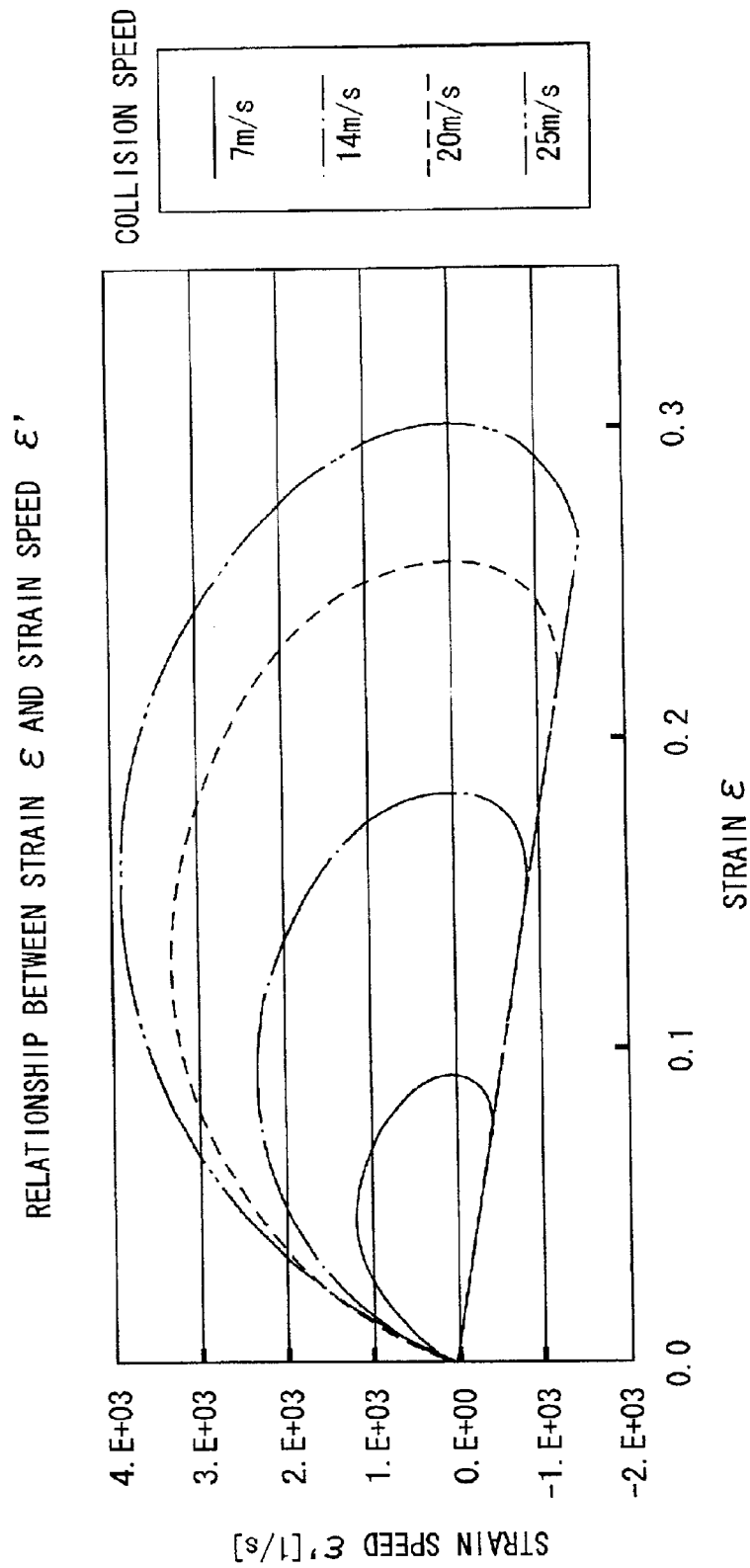
FIG. 24 shows the relationship between the strain and the strain speed in the third embodiment.

FIG. 23 shows the relationship between the strain $\epsilon$ and the viscosity resistance $\eta$ obtained from the time history data of the strain and the viscosity resistance. As shown in FIG. 23, at an equal value of the strain, the value of the viscosity resistance in the strain increase state is different from the value thereof in the strain decrease state (or restoration state). FIG. 24 shows the relationship between the strain and the strain speed obtained from the time history data of the strain and the strain speed. As shown in FIG. 24, the viscosity resistance changes in dependence on the variation of the strain and the strain speed and different between the strain increase state and the strain decrease state (or restoration state). Thus the viscosity resistance can be determined in dependence on the strain and the strain speed and is computed separately in each of the strain increase state and the strain decrease state (or restoration state). That is, the viscosity resistance is the function of the strain and the strain speed. In FIG. 24, the data (curves) of the four different collision speeds seem to overlap each other linearly in the negative region of the strain speed. However the curves have different strains and strain speeds in dependence on the four different collision speeds.

In each collision speed, The simulation is conducted by writing the relationship between the strain and the viscosity resistance shown in FIG. 23 and the relationship between the strain and the strain speed shown in FIG. 24 as input data, as will be described later and by carrying out the analysis based on the finite element method in consideration of a phenomenon that the viscosity resistance changes in dependence on a variation of the strain and the strain speed and is different in its value between the strain increase state and the strain decrease state (or restoration state).

Similarly to the first embodiment, in the third embodiment, a one-piece ball containing butadiene rubber as its main component is set as a product model made of the viscoelastic material to conduct a simulation, assuming that a golf club head collides with a golf ball.

Based on a set condition similar to that of the first embodiment, the data of the golf ball model 10 and the relationship among the strain, the strain speed, and the viscosity resistance are written as the input data in computations to be performed in the simulation. When the computation is performed, an appropriate viscosity resistance is computed for each element momently from the equations, and the computations are performed by using the viscosity resistances. In the simulation of the third embodiment, two-dimensional data of the relationship between the strain and the strain speed and between the strain and the viscosity resistance in each of the strain increase state and the strain decrease state (or restoration state) are inputted to perform the computations. From time series data of the strain and the strain speed in each of the four patterns different from one another in measuring conditions, the correspondence relationship between the strain and the strain speed is recorded, and the strain, the strain speed, and the viscosity resistance corresponding to the strain as well as the strain speed are written as the input data. In the case of a strain and a strain speed not the same as the data of the strains and the strain speeds measured under the four different measuring conditions, a primary interpolation is performed by using a binary value of the viscosity resistance determined in dependence on a strain and a strain speed close to one of the strains and the strain speeds measured under the four different measuring conditions.

More specifically, information of a strain and a strain speed generated in one element is obtained by giving attention to the element. Thereafter based on the relationship between the strain and the strain speed obtained from measurement in each collision case (measurement case), reference is made to the value of the strain speed when the strain having an equal value is generated in each collision case. Then two collision cases each having the value of the strain speed close to the value of the strain speed of the attention-given element are searched. By using the value of each of the strain speed and the viscosity resistance when the values of the strains corresponding to the strain speeds of the two collision cases are equal to each other, the interpolation is performed to compute an appropriate value of the viscosity resistance corresponding to the strain and the strain speed generated in the attention-given element. That is, in the third embodiment, the primary interpolation is performed. By determining the viscosity resistance of each element in dependence on the strain and the strain speed generated therein, the physical property of the viscoelastic material of each element is expressed for each element at an appropriate strain and strain speed.

The speed of the cylindrical hollow rod model 20 and that of the golf ball model 10 before and after the collision therebetween are computed by using a method similar to that of the first embodiment. The restitution coefficient of the golf ball model 10 is computed from the speed and weight of each of the cylindrical hollow rod model 20 and the golf ball model 10 to estimate the performance of the golf ball model 10.

As described above, the simulation is conducted by determining the viscosity resistance separately in each of the strain increase state and the strain decrease state (or restoration state) as the function of the strain and the strain speed, inputting the relationship among the strain, the strain speed, and the viscosity resistance to the golf ball model, and carrying out the analysis based on the finite element method. Therefore the viscosity resistance can be computed momently in correspondence to the strain and the strain speed of each element. Further the difference in the value of the viscosity resistance between the strain increase state and the strain decrease state (or restoration state) is considered. Therefore it is possible to estimate with high precision the characteristic of the viscoelastic material having nonlinearity in the condition in which the golf ball model deforms greatly at a high speed.

Figure 25:
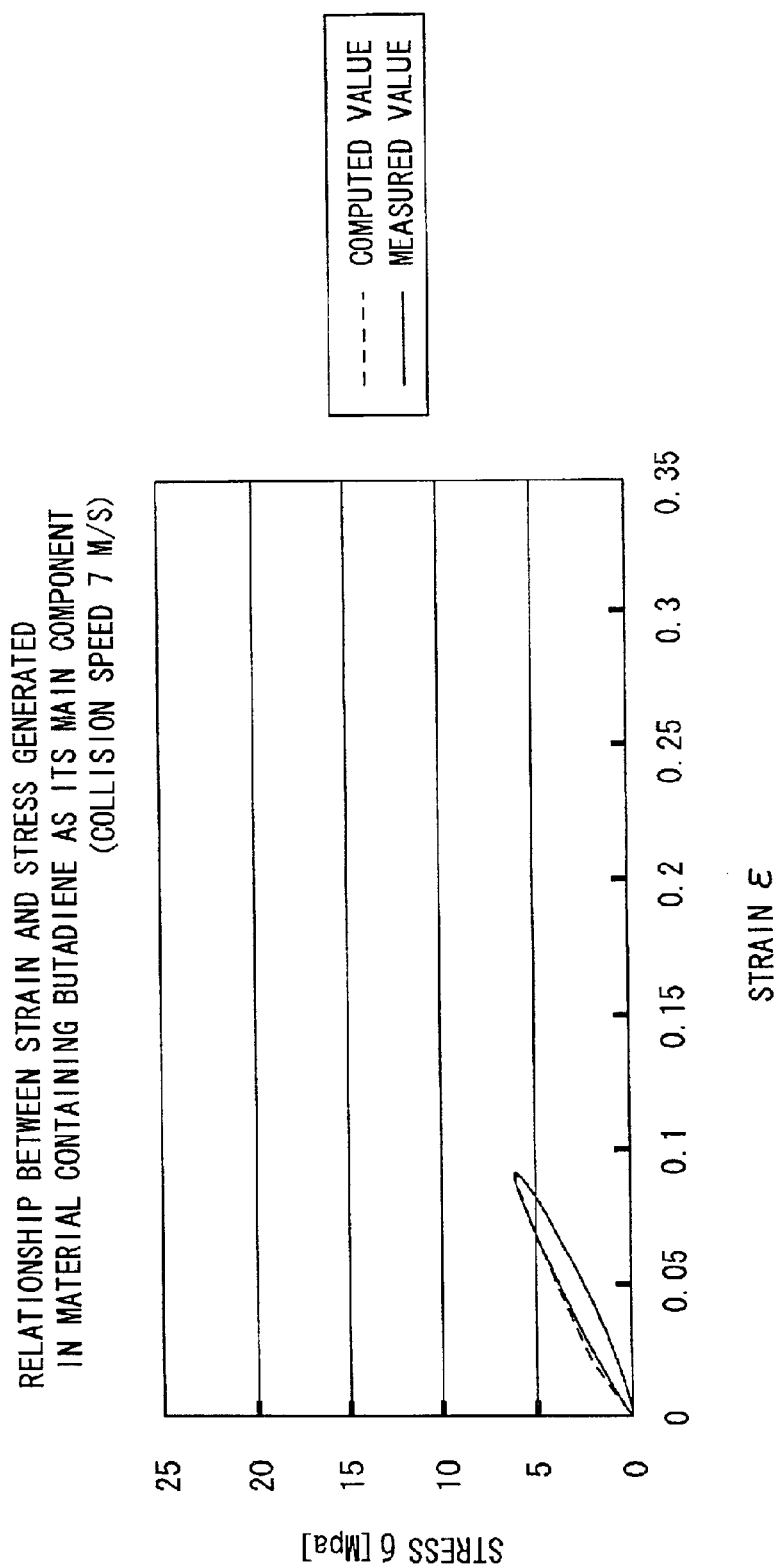
FIG. 25 shows the relationship between a measured value of each of a strain and a stress generated in a material containing butadiene rubber as its main component and a computed value of each of a strain and a stress when a collision speed of an impact bar is 7 m/s.
Figure 26:
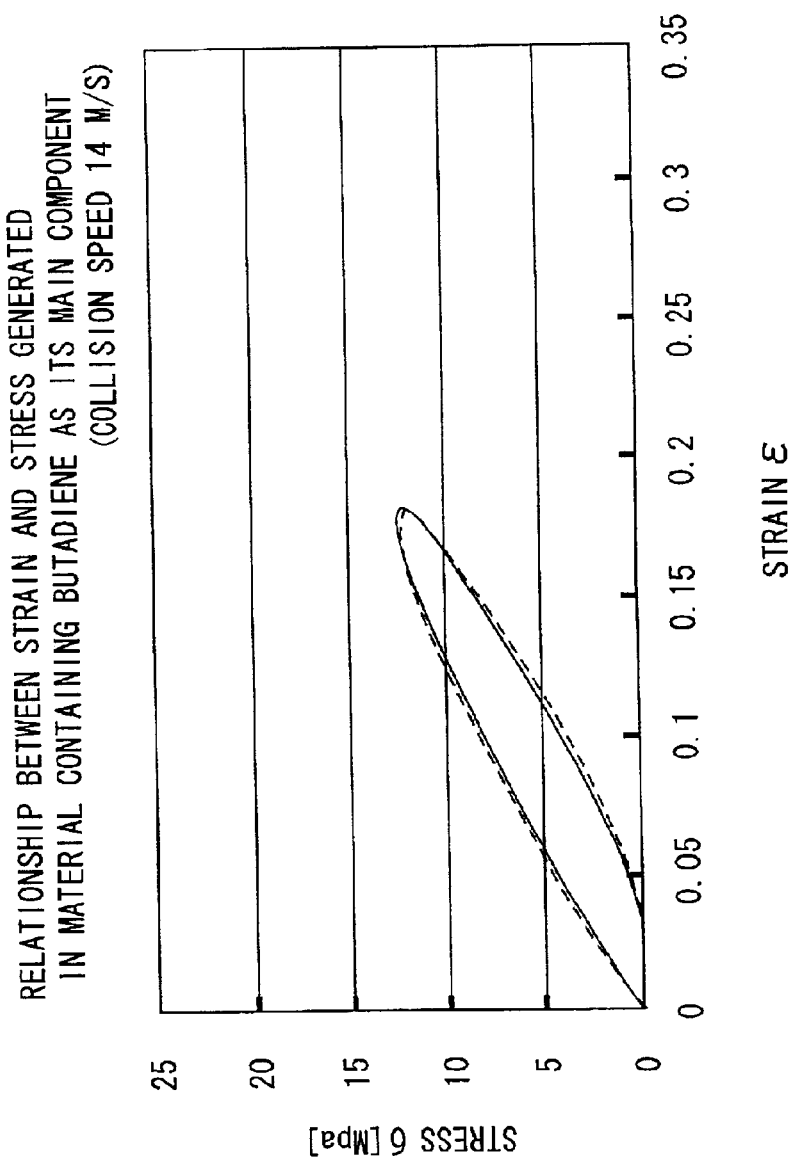
FIG. 26 shows the relationship between a measured value of each of a strain and a stress generated in the material containing the butadiene rubber as its main component and a computed value of each of a strain and a stress when a collision speed of an impact bar is 14 m/s.
Figure 27:
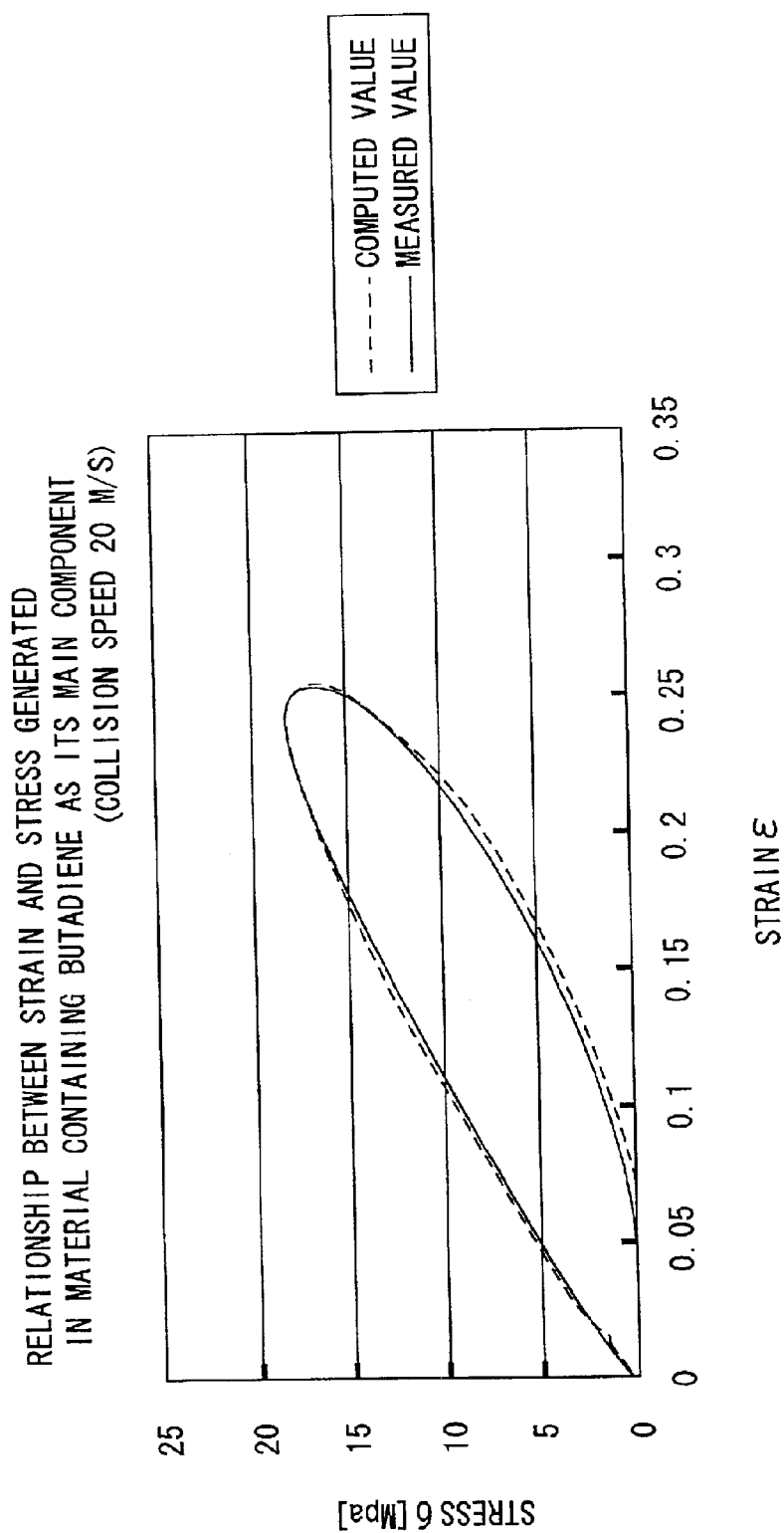
FIG. 27 shows the relationship between a measured value of each of a strain and a stress generated in the material containing the butadiene rubber as its main component and a computed value of each of a strain and a stress when a collision speed of an impact bar is 20 m/s.
Figure 28:
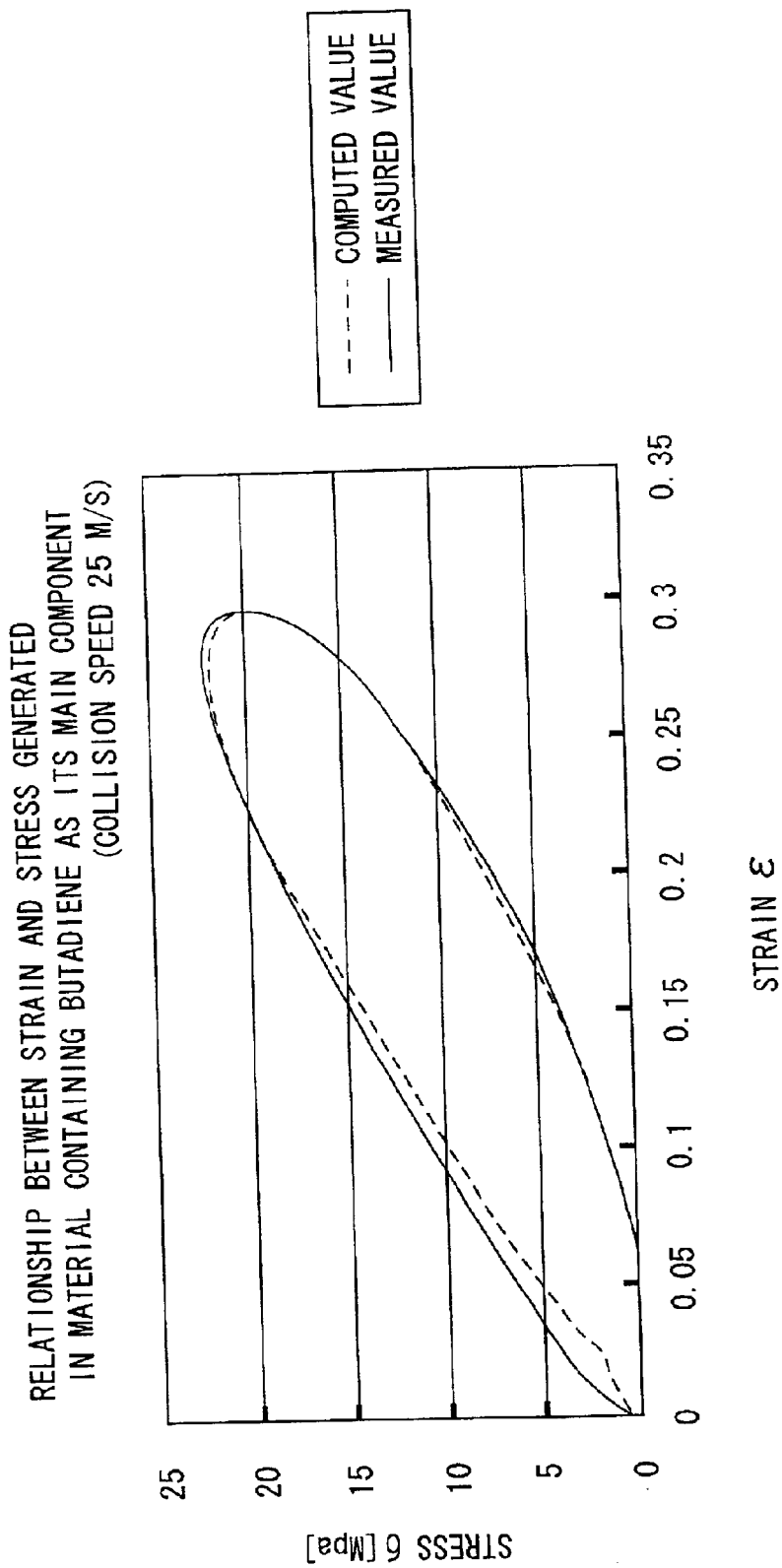
FIG. 28 shows the relationship between a measured value of each of a strain and a stress generated in the material containing the butadiene rubber as its main component and a computed value of each of a strain and a stress when a collision speed of an impact bar is 25 m/s.

The value of each of the strain and the stress generated in the viscoelastic material of the third embodiment was measured by the split Hopkinson's bar tester by varying the collision speed of its impact bar. The viscoelastic material contained the butadiene rubber as its main component. FIGS. 25 though 28 show the relationship between the measured value of each of the strain and the stress and the value of each of the strain and the stress computed by the above-described simulation method at each collision speed. FIGS. 25, 26, 27, and 28 show the relationship between the measured value of the strain and the stress and the value of the strain and the stress computed in the simulation method when the collision speed is 7 m/s, 14 m/s, 20 m/s, and 25 m/s respectively. In any of the collision speeds, the configuration of the loop curve of the computed value is almost coincident with that of the loop curve of the measured value. This indicates that the simulation method of the present invention is capable of estimating the performance of the viscoelastic material with high accuracy.

Figure 29:
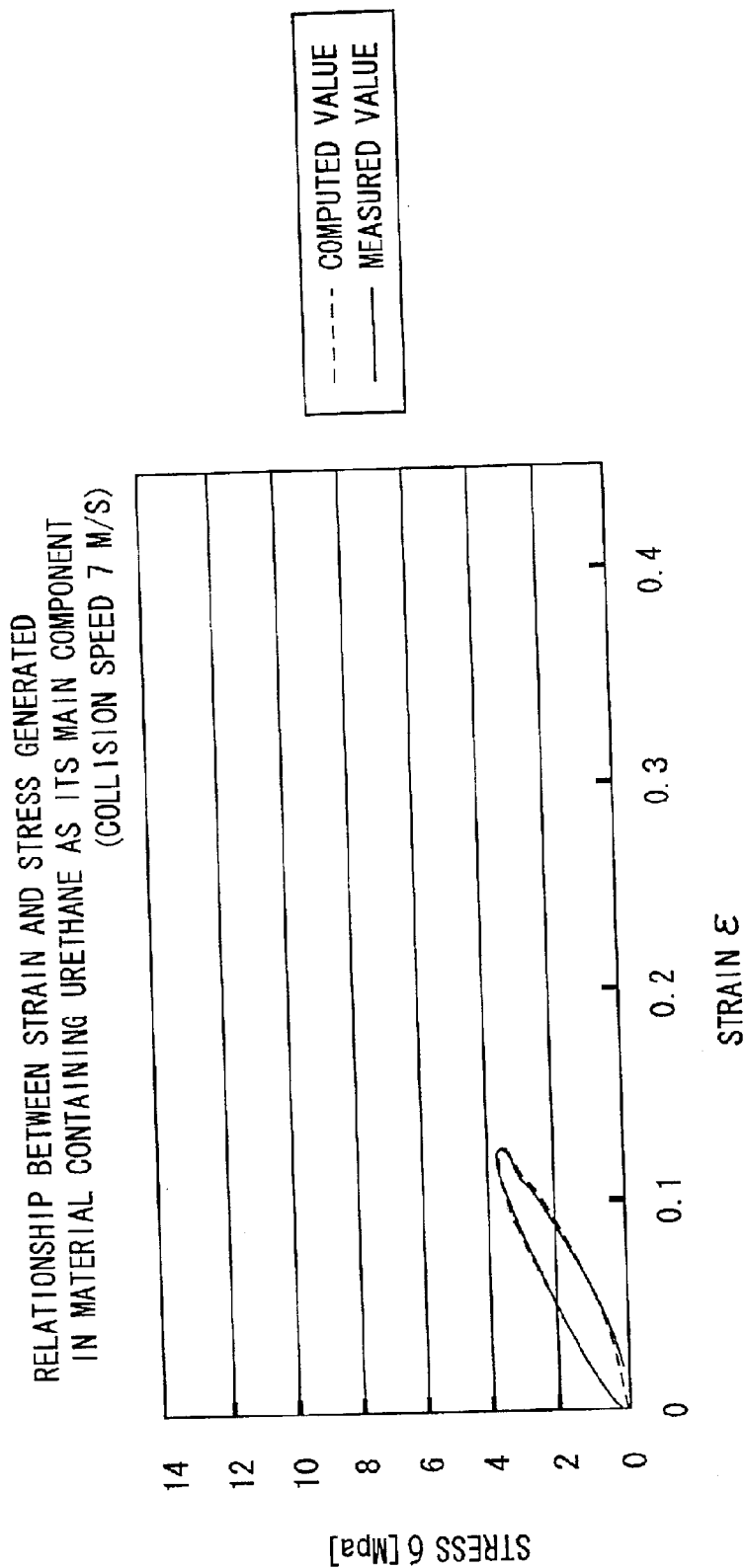
FIG. 29 shows the relationship between a measured value of each of a strain and a stress generated in a material containing urethane rubber as its main component and a computed value of each of a strain and a stress when a collision speed of an impact bar is 7 m/s.
Figure 30:
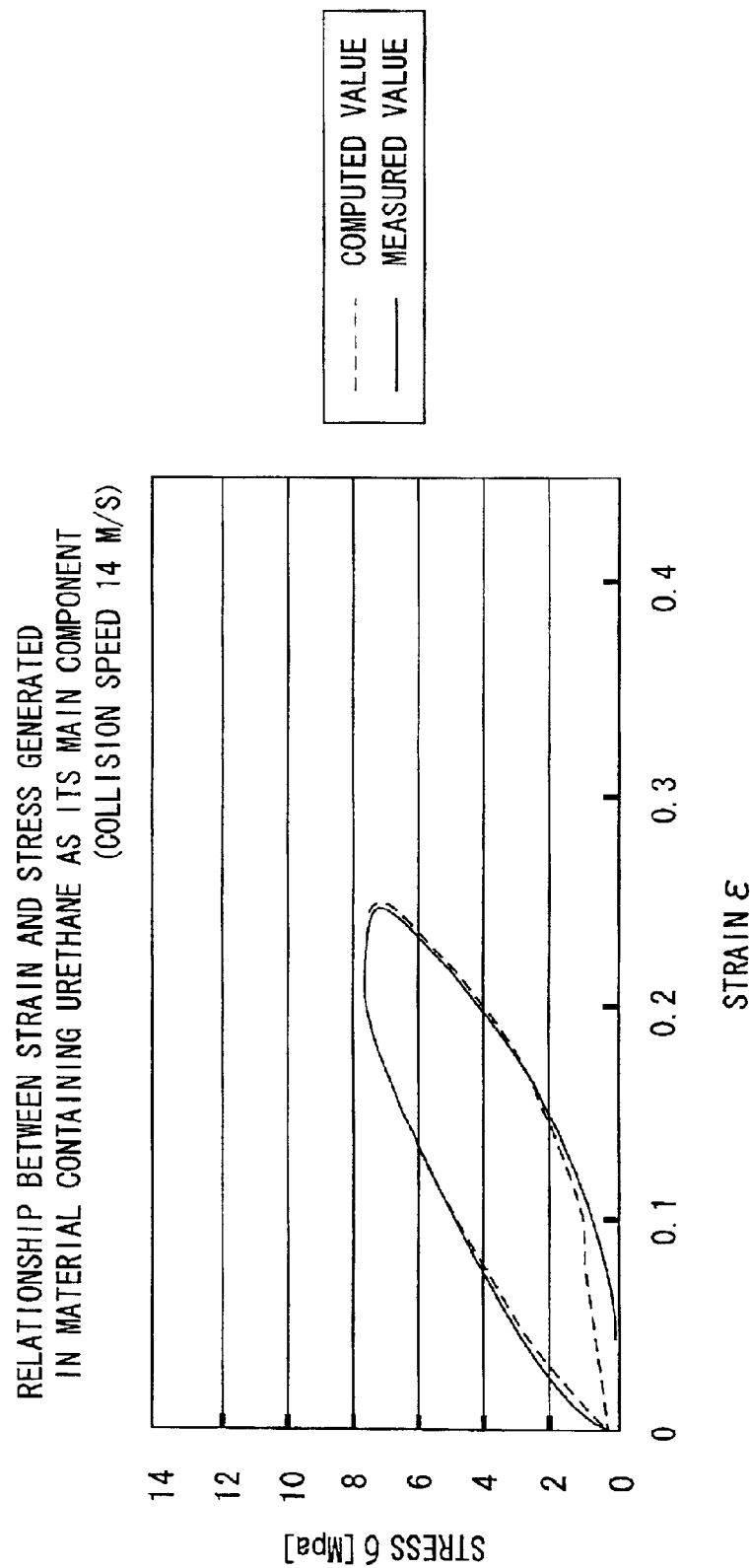
FIG. 30 shows the relationship between a measured value of each of a strain and a stress generated in the material containing the urethane rubber as its main component and a computed value of each of a strain and a stress when a collision speed of an impact bar is 14 m/s.
Figure 31:
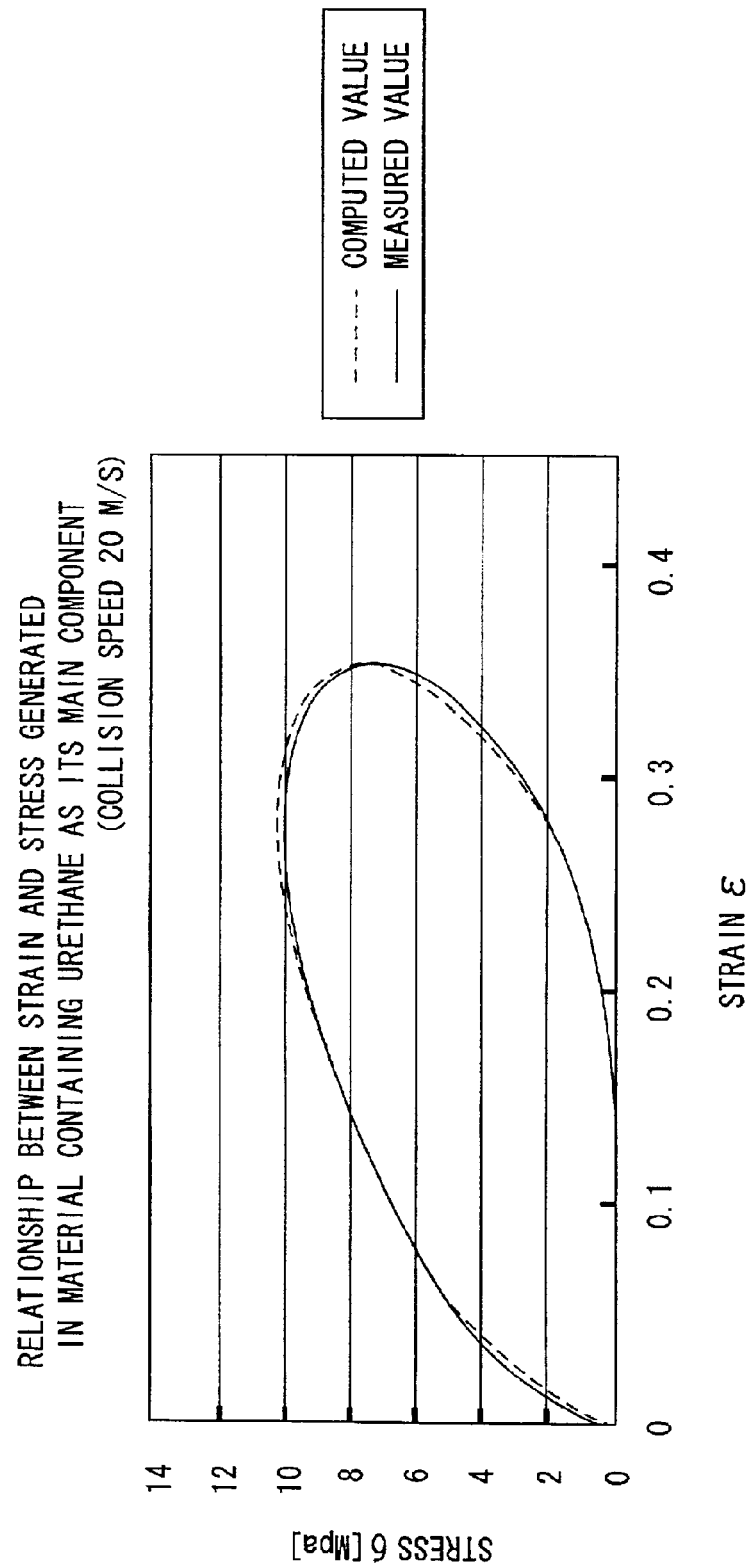
FIG. 31 shows the relationship between a measured value of each of a strain and a stress generated in the material containing the urethane rubber as its main component and a computed value of each of a strain and a stress when a collision speed of an impact bar is 20 m/s.
Figure 32:
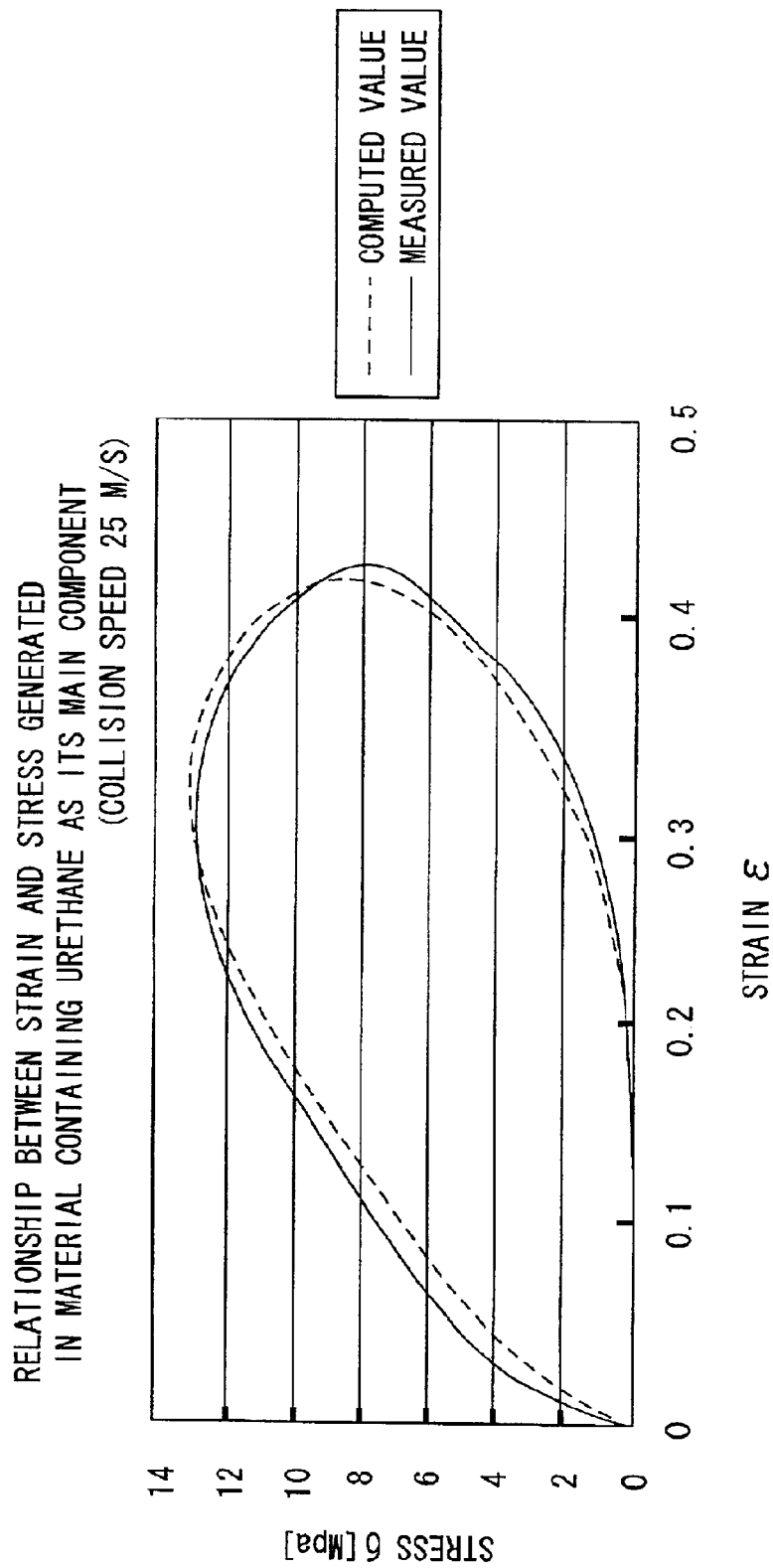
FIG. 32 shows the relationship between a measured value of each of a strain and a stress generated in the material containing the urethane rubber as its main component and a computed value of each of a strain and a stress when a collision speed of an impact bar is 25 m/s.

Instead of the viscoelastic material containing the butadiene rubber as its main component, a viscoelastic material containing the urethane rubber as its main component was used. Similarly, the value of each of the strain and the stress generated in the material was measured by the split Hopkinson's bar tester by varying the collision speed of its impact bar. FIGS. 29 though 32 show the relationship between the measured value of each of the strain and the stress and the value of each of the strain and the stress computed by a method similar to that of the first embodiment. FIGS. 29, 30, 31, and 32 show the relationship between the measured value of the strain and the stress and the value of the strain and the stress computed in the simulation method when the collision speed is 7 m/s, 14 m/s, 20 m/s, and 25 m/s respectively. In any of the collision speeds, as in the case of the viscoelastic material containing the butadiene rubber as its main component, the configuration of the loop curve of the computed value is almost coincident with that of the loop curve of the measured value. This indicates that the simulation method of the present invention is capable of estimating the performance of the viscoelastic material with high accuracy.

[Measurement Conducted by Split Hopkinson's Bar Tester to Measure Physical Property of Material]

Figure 33:
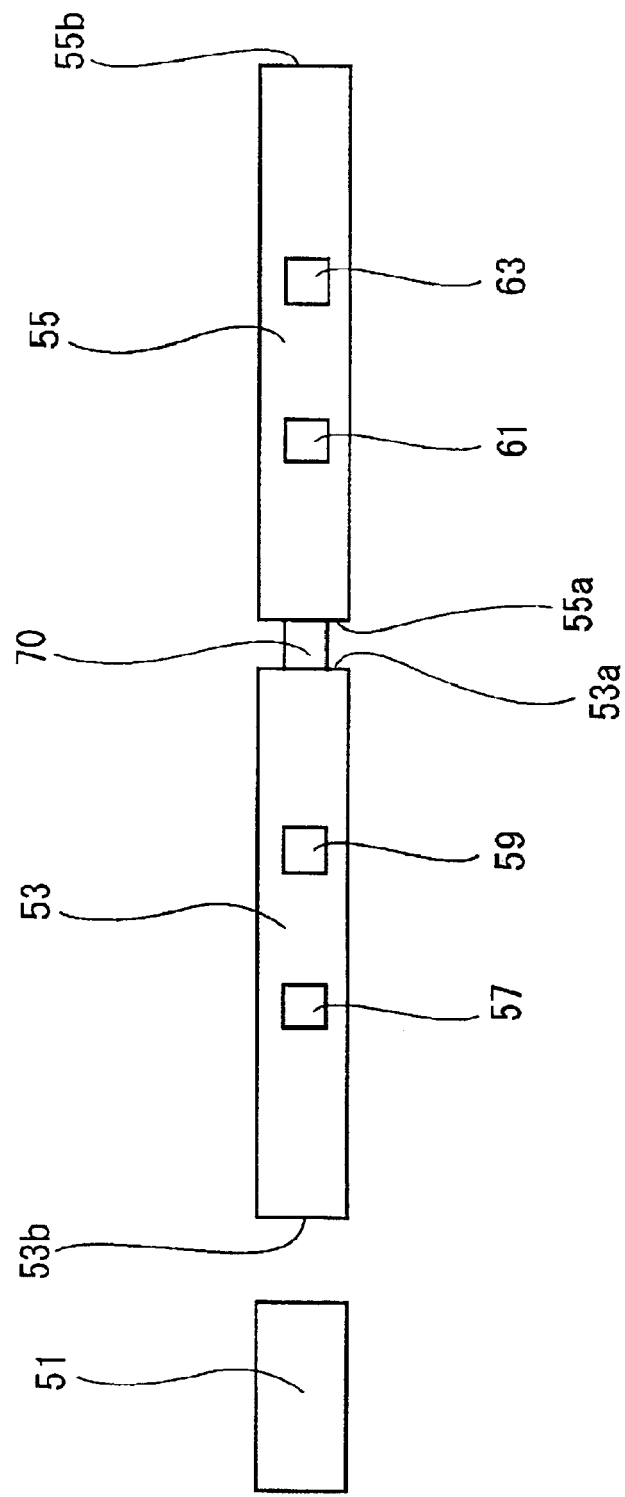
FIG. 33 is an illustrative front view showing a split Hopkinson's bar tester.

FIG. 33 is an illustrative front view showing a split Hopkinson's bar tester improved in its construction to measure the strain and the like of the viscoelastic material.

The split Hopkinson's bar tester shown in FIG. 33 has an impact bar 51, an input bar 53, and an output bar 55. These rods are arranged linearly. A first strain gauge 57 and a second strain gauge 59 are installed on the input bar 53. A third strain gauge 61 and a fourth strain gauge 63 are installed on the output bar 55. A columnar specimen 70 is sandwiched between a rear end 53a of the input bar 53 and a front end 55a of the output bar 55.

The specimen 70 may be formed by molding the viscoelastic material into a predetermined configuration or cutting a product made of the viscoelastic material by molding the viscoelastic material into the predetermined configuration. In the embodiment, the specimen 70 has a length (distance between the rear end 53a of the input bar 53 and the front end 55a of the output bar 55) of 4 mm and a sectional diameter of 18 mm.

The impact bar 51, the input bar 53, and the output bar 55 are cylindrical and made of polymethyl methacrylate. The sectional diameter of each of the input bar 53 and the output bar 55 is set to 20 mm. The modulus of direct elasticity of each of the input bar 53 and the output bar 55 is set to 5300 Mpa. The specific gravity of each of the input bar 53 and the output bar 55 is set to 1.19. The length of the impact bar 51 is set to 100 mm. The length of each of the input bar 53 and the output bar 55 (hereinafter may be referred to as stress rod) is set to 2000 mm.

The first strain gauge 57 is installed on the input bar 53 at a position spaced 900 mm from the rear end 53a thereof. The second strain gauge 59 is installed on the input bar 53 at a position spaced 600 mm from the rear end 53a thereof. The third strain gauge 61 is installed on the output bar 55 at a position spaced 300 mm from the front end 55a thereof. The fourth strain gauge 63 is installed on the output bar 55 at a position spaced 600 mm from the front end 55a thereof.

In the split Hopkinson's bar tester shown in FIG. 33, the impact bar 51, the input bar 53, and the output bar 55 are made of synthetic resin consisting of polymethyl methacrylate. The input bar 53 and the output bar 55 are as long as 2000 mm. The distance between the first strain gauge 57 and the rear end 53a of the input bar 53 is long. The distance between the second strain gauge 59 and the rear end 53a of the input bar 53 is also long. Therefore, the split Hopkinson's bar tester is suitable for measuring the strain, the strain speed, and the stress of a viscoelastic material such as crosslinked rubber which is used for a golf ball.

A monoaxial strain gauge for plastic is used as the first strain gauge 57, the second strain gauge 59, the third strain gauge 61, and the fourth strain gauge 63. In the embodiment, a monoaxial strain gauge manufactured by Kyowa Dengyo Kabushiki Kaisha is used. The monoaxial strain gauge is bonded to the above-described positions of the input bar 53 and the output bar 55. The first strain gauge 57 through the fourth strain gauge 63 are installed on the input bar 53 and the output bar 55 linearly in the longitudinal direction thereof.

In measuring the strain of the specimen, its strain speed, and its stress with the split Hopkinson's bar tester, initially, the impact bar 51 is brought into collision with the front end 53b of the input bar 53 at a predetermined speed. Thereby, an incident distorted wave is generated in the input bar 53. The incident distorted wave advances to the rear end 53a of the input bar 53. A part of the incident distorted wave is reflected from the rear end 53a of the input bar 53 to generate a reflected distorted wave. The reflected distorted wave advance to the front end 53b of the input bar 53. A part of the incident distorted wave advances to the specimen 70 from the rear end 53a of the input bar 53 and propagates to the output bar 55 to generate a transmitted distorted wave. The transmitted distorted wave advances to the rear end 55b of the output bar 55.

The incident distorted wave is measured with the first strain gauge 57 and the second strain gauge 59. The incident distorted wave is passed through a low-pass filter to remove a high-frequency wave having a frequency more than 10 KHz from the incident distorted wave. Zero compensation is performed to make the base line value of the time history of the incident distorted wave zero. Fourier transformation of an obtained time base strain at each of the first strain gauge 57 and the second strain gauge 59 is performed to determine a frequency axis strain. A transmission function is derived from the frequency axis strain at the first strain gauge 57 and the second strain gauge 59. Based on the transmission function, the frequency axis strain at the rear end 53a of the input bar 53 is estimated in consideration of the ratio of the distance X1 between the first strain gauge 57 and the rear end 53a of the input bar 53 to the distance X2 between the second strain gauge 59 and the rear end 53a of the input bar 53. Fourier inverse transformation of the frequency axis strain is performed to obtain a time base strain (time history of strain) ϵi of the incident distorted wave at the rear end 53a of the input bar 53.

Similarly, the second strain gauge 59 and the first strain gauge 57 measure the reflected distorted wave reflected from the rear end 53a of the input bar 53 and advancing to the front end 53b of the input bar 53. A time base strain (time history of strain) ϵr of the reflected distorted wave at the rear end 53a of the input bar 53 is obtained from the measured reflected distorted wave.

The transmitted distorted wave which propagates to the output bar 55 through the specimen 70 is measured with the third strain gauge 61 and the fourth strain gauge 63 installed on the output bar 55. A time base strain (time history of strain) ϵt of the transmitted distorted wave at the front end 55a of the output bar 55 is obtained from the measured transmitted distorted wave.

From the obtained time base strains ϵi, ϵr, and ϵt, a strain speed ϵ' of the specimen 70 is computed by using an equation (6) shown below.
(Equation 6)

$$\varepsilon' = (C_0/L) \cdot (\varepsilon i - \varepsilon r - \varepsilon t) \qquad (6)$$
$$= \left((E/\rho)^{\frac{1}{2}}/L\right) \cdot (\varepsilon i - \varepsilon r - \varepsilon t)$$

where $C_0$ indicates the propagation speed (m/s) of the strain wave in the stress rod and the output bar, L indicates the length (m) of the specimen, E is the modulus of direct elasticity (N/m²) of the stress rod, and ρ is the density (kg/m³) of the stress rod.

From the time base strains ϵi, ϵr, ϵt, the strain ϵ of the specimen 70 is computed by using an equation (7) shown below.
(Equation 7)

$$\varepsilon = (CO/L) \cdot \int_0^t (\varepsilon i - \varepsilon r - \varepsilon t) dt \qquad (7)$$
$$= \left((E/\rho)^{\frac{1}{2}}/L\right) \cdot \int_0^t (\varepsilon i - \varepsilon r - \varepsilon t) dt$$

where $C_0$ indicates the propagation speed (m/s) of the strain wave in the stress rod and the output bar, L indicates the length (m) of the specimen, E is the modulus of direct elasticity (N/m²) of the stress rod, and ρ is the density (kg/m³) of the stress rod.

From the time base strains ϵi, ϵr, and ϵt, the stress σ of the specimen 70 is computed by using an equation (8) shown below.

$$\sigma = (E \cdot A/(2As)) \cdot (\varepsilon i + \varepsilon r + \varepsilon t) \qquad (8)$$
$$= (E \cdot D^2/(2(Ds)^2)) \cdot (\varepsilon i + \varepsilon r + \varepsilon t)$$

where E indicates the modulus of direct elasticity (N/m²) of the stress rod consisting of the input bar and the output bar; A indicates the sectional area (m²) of the stress rod; As indicates the sectional area (m²) of the specimen; D indicates the diameter (m) of the stress rod; and Ds indicates the diameter (m) of the specimen.

Figure 34:
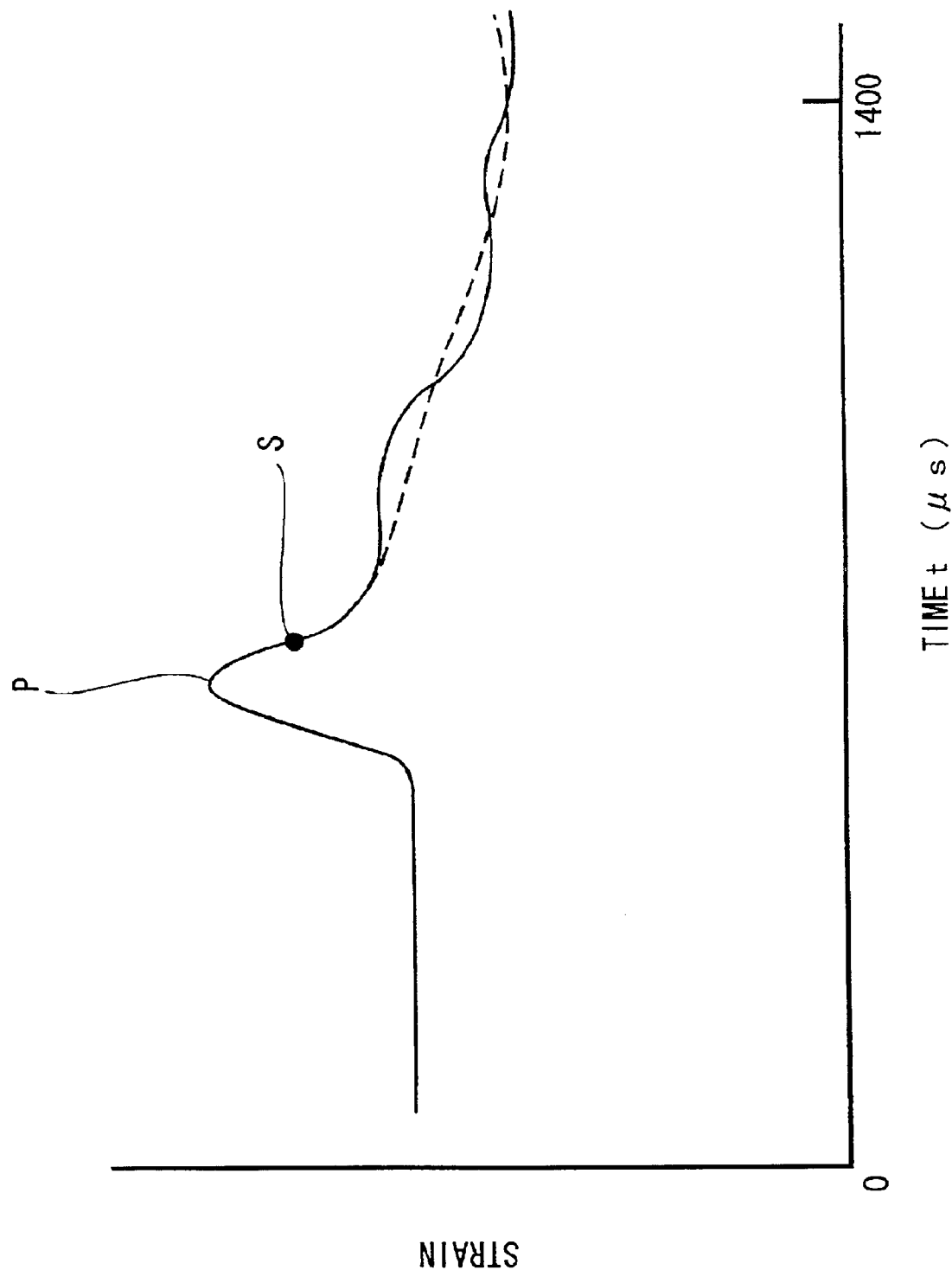
FIG. 34 shows a state of a time history of a strain of a specimen.

FIG. 34 shows the obtained strain time history of the specimen 70. As shown in FIG. 34, the curve is smooth for a certain period of time after a time corresponding to a peak P. After a time corresponding to a given point of the graph FIG. 34, the curve becomes irregular. A point S is selected in the curve-smooth stage between the peak P and the given point. A tangent to the curve at the point S is drawn. A relaxation time λ is derived from the intersection of the tangent and the time base. A curve found by using an equation (9) shown below is determined as the curve after the point S of FIG. 34. In this manner, the entire strain time history is corrected to a smooth curve (shown with a one-dot line in FIG. 34). Thereby, it is possible to remove the influence of noise on an obtained viscoelastic characteristic value.
(Equation 9)

$$\epsilon(t) = \epsilon 0 \cdot e^{-t/\lambda} \qquad (9)$$

where ϵ0 is a strain at the point of contact.

Similarly, it is possible to make an entire stress time history a smooth curve by using an equation (10) shown below. Thereby, it is possible to remove the influence of noise on an obtained viscoelastic characteristic value.
(Equation 10)

$$\sigma(t) = \sigma 0 \cdot e^{-t/\lambda} \qquad (10)$$

where σ0 is a stress at the point of contact.

The time history of the strain and the stress of the specimen 70 are corrected, as described above.

By using the split Hopkinson's bar tester, the time history data of the strain, the strain speed, and the stress are obtained, as described above.

An example of the present invention and a comparison example will be described below in detail.

Using a material containing urethane rubber as its main component, a golf ball was prepared. The material was compression-molded in a die having a diameter of 42.8 mm at 160° C. for 30 minutes to form a one-piece golf ball.

The strain, strain speed, and stress of the material containing urethane as its main component were measured with the split Hopkinson's bar tester in collision speeds (7 m/s, 14 m/s, 20 m/s, and 25 m/s) of the impact bar at a room temperature of 23° C. and a relative humidity of 50%.

The maximum strain and the maximum strain speed in the measurement are shown below.

Collision speed 7 m/s (maximum strain: 0.12, maximum strain speed: 1378/s)

Collision speed 14 m/s (maximum strain: 0.24, maximum strain speed: 2703/s)

Collision speed 20 m/s (maximum strain: 0.35, maximum strain speed: 3898/s)

Collision speed 25 m/s (maximum strain: 0.43, maximum strain speed: 4716/s)

The phase angle δ at each of the four collision speeds is shown in table 1 below.

TABLE 1

| Collision speed of impact bar (m/s) | 7 | 14 | 20 | 25 |
|---|---|---|---|---|
| Result of experiment phase angle δ (rad) | 0.39 | 0.63 | 1.02 | 1.11 |
| Example phase angle δ (rad) | 0.36 | 0.58 | 0.98 | 0.99 |
| Comparison example phase angle δ (rad) | 0.77 | 0.81 | 0.87 | 0.87 |

EXAMPLE

The split Hopkinson's bar tester measured the strain, strain speed, and stress of a material of a specimen containing urethane rubber as its main component. A simulation was conducted by using the time history data of each of the strain, strain speed, and stress of the material and a viscoelastic model similar to that of the first embodiment in consideration of the value of the viscosity resistance in each of the strain increase state and the strain decrease state (or restoration state). The relationship among the strain, the strain speed, and the modulus of direct elasticity was inputted to the product model used in the simulation method of the first embodiment in consideration of the change of the modulus of direct elasticity which occurs in dependence on the variation of the strain and the strain speed.

A phase angle δ estimated by the simulation of the example is shown in table 1.

COMPARISON EXAMPLE

A simulation was conducted by using a conventional viscoelastic material whose viscosity resistance does not change with reference to the loss factor, of the material containing urethane rubber as its main component, measured by the split Hopkinson's bar tester. The loss factor was measured by the split Hopkinson's bar tester.

A phase angle δ estimated by the simulation of the comparison example is shown in table 1.

By performing an analysis based on the finite element method, an aluminum hollow rod model having a weight of 200 g (same as the weight of golf club head) collided with a golf ball made of the material containing urethane rubber as its main component at speeds of 35 m/s, 40 m/s, and 45 m/s to simulate the performance of the golf ball and the deformation state of the material, and the restitution coefficient of the golf ball was computed by the analysis based on the finite element method. Table 2 shown below indicates the restitution coefficient of the golf ball, made of the material containing urethane rubber as its main component, computed in performing an analysis based on the finite element method in the example and the comparison example.

TABLE 2

| Initial speed (m/s) of aluminum hollow rod (m/s) | 35 | 40 | 45 |
|---|---|---|---|
| Restitution coefficient (experiment) | 0.63 | 0.60 | 0.56 |
| Restitution coefficient (comparison example) | 0.46 | 0.44 | 0.42 |
| Difference from example (%) | −27.02 | −25.80 | −24.70 |
| Restitution coefficient (example) | 0.60 | 0.56 | 0.53 |
| Difference from example (%) | −4.82 | −5.26 | −5.98 |

An experiment was conducted by using an actual golf ball made by molding the material containing urethane rubber as its main component to measure the restitution coefficient of the golf ball by the following method.

Table 2 also shows the difference (%) between the restitution coefficient obtained in the experiment using the following actual golf ball and those obtained by the analysis made in the example as well as the comparison example.

[Measurement of Restitution Coefficient in Experiment Using Actual Golf Ball]

As the method of measuring the restitution coefficient of the golf ball, as a substitution of a golf club head, an aluminum hollow rod model having a weight of 200 g (same as the weight of a golf club head) collided with a golf ball made of the material containing urethane as its main component at speeds of 35, 40, and 45 m/s. The temperature was 23° C. The speed of the hollow rod and that of the golf ball model 10 before and after the collision therebetween were measured. The restitution coefficient of the golf ball was computed from the speed and weight of the hollow rod and the golf ball.

The collision surface of the hollow rod was flat. The hollow rod collided head-on with the golf ball model. Since the hollow rod was not cornered like the golf club head, the golf ball did not rotate when both collided with each other. Thus only the restitution coefficient of the golf ball could be evaluated.

As shown in table 1, the phase angle δ in the analysis of the example was almost equal to that in the experiment at each collision speed. On the other hand, the phase angle δ in the analysis of the comparison example was much different from that in the experiment at each collision speed. It could be confirmed that the example could simulate the result of the experiment with high accuracy.

As shown in table 2, at each of the collision speeds of the hollow rod model, the value of the restitution coefficient in the analysis of the example was close to that computed on the actual golf ball prepared in the experiment. The difference of the restitution coefficient of the example from that of the experiment was −4.82%–−5.98%. This indicates that the example could simulate the result of the experiment with high accuracy. On the other hand, at each of the collision speeds of the hollow rod model, the value of the restitution coefficient in the analysis of the comparison example was much different from that computed on the actual golf ball prepared in the experiment. The difference of the restitution coefficient of the example from that of the experiment was −24.70%–−27.02%. The simulation of the comparison example was much different from the result of the experiment.

As apparent from the foregoing description, it could be confirmed that since the simulation is conducted in consideration of the viscosity of the viscoelastic material, it is possible to accurately estimate the performance of a product made of the viscoelastic material showing nonlinearity in a measuring condition equivalent to a state in which the product is actually used.

As apparent from the foregoing description, in the first aspect of the present invention, using the viscoelastic model set in consideration of the viscosity of the viscoelastic material, the simulation is conducted by deriving the viscosity resistance of the viscoelastic material and inputting the relationship among the strain, the strain speed, and the viscosity resistance to the product model. Therefore it is possible to accurately express a phenomenon that the physical property of the viscoelastic material changes nonlinearly with its deformation speed and magnitude.

In the second aspect of the present invention, the modulus of direct elasticity of the viscoelastic material which changes in dependence on a measuring condition is computed from the time history data of the strain and the stress measured in each measuring condition to conduct a simulation in consideration of the change of the modulus of direct elasticity corresponding to the variation of the strain and the strain speed. Therefore it is possible to accurately express the phenomenon that the physical property of the viscoelastic material changes nonlinearly in dependence on its deformation speed and magnitude.

In the third aspect of the present invention, using the viscoelastic model set in consideration of the viscosity of the viscoelastic material, the simulation is conducted by deriving the viscosity resistance of the viscoelastic material separately in each of the strain increase state of the strain generated therein and the strain decrease state and inputting the relationship among the strain, the strain speed, and the viscosity resistance to the, product model. Therefore it is possible to accurately express a phenomenon that the physical property of the viscoelastic material changes nonlinearly with its deformation speed and magnitude. Even though at an equal value of the strain, the value of the viscosity resistance in the strain increase state and the value thereof in the strain decrease state (or restoration state) are separately derived. These values are used as input values. Therefore the simulation can be accomplished with high precision.

Further because the value of each of the strain, the strain speed, and the strain is measured in a measuring condition equivalent to a state in which the product made of the viscoelastic material is actually used, it is possible to conduct a simulation in correspondence to various deformation states of the viscoelastic material.

Accordingly it is possible to accurately analyze the performance and the dynamic behavior of a product made of the viscoelastic material in which the relationship between the strain and the strain speed changes owing to a deformation state of the viscoelastic material and whose physical property such as a loss factor shows nonlinearity.

The simulation method is capable of accurately estimating an actual hitting test, assuming that the viscoelastic material is subjected to a strain, a strain speed, and a stress equivalent to those generated in the viscoelastic material of an actual golf ball when it is actually hit with the golf club head. Therefore simulation method is capable of accurately estimating the performance and deformation behavior of the golf ball in a state close to an actual hitting state. Thereby the simulation method is capable of easily apprehend the physical property of the viscoelastic material which determines the performance of the golf ball, which contributes to the improvement of the product and reduces the number of trial manufacture of the golf ball in a designing stage and cost and time required for the trial manufacture.

What is claimed is:

1. A simulation method for estimating performance of a product made of a viscoelastic material, comprising the steps of:

measuring at a moment a value of a strain, a strain speed, and a stress generated in said viscoelastic material in a measuring condition equivalent to a state in which said product is actually used;

deriving time history data of a viscosity resistance of said viscoelastic material from time history data of said strain, said strain speed, and said stress and a viscoelastic model set in consideration of a viscosity of said viscoelastic material;

setting said product made of said viscoelastic material as a product model of which performance is analyzed and inputting a relationship among said strain, said strain speed, and said viscosity resistance to said product model; and simulating in consideration of a phenomenon that said viscosity resistance changes depending on a variation of said strain and said strain speed, whereby the performance of said viscoelastic model made of said viscoelastic material is estimated.

2. The simulation method according to claim 1, wherein said viscoelastic material exhibits nonlinear physical properties.

3. The simulation method according to claim 1, wherein said simulation is conducted by an analysis based on a finite element method.

4. The simulation method according to claim 1, wherein a split Hopkinson's bar tester measures said strain, said strain speed, and said stress.

5. The simulation method according to claim 1, wherein a maximum value of said strain generated in said viscoelastic material at said measuring time is in a range of 0.05 to 0.50 and/or a maximum value of said strain speed is in a range of 500/s to 10000/s.

6. The simulation method according to claim 1, wherein said viscoelastic material is used for a golf ball, and said product model is a golf ball.

7. The simulation method according to claim 6, wherein a phenomenon of a collision between said golf ball and a hitting object assumed to be a golf club head is simulated to estimate a behavior of said golf ball at the time of said collision.

* * * * *